United States Patent
Kaihotsu et al.

(10) Patent No.: US 8,531,126 B2
(45) Date of Patent: Sep. 10, 2013

(54) WHITE LIGHT EMITTING APPARATUS AND LINE ILLUMINATOR USING THE SAME IN IMAGE READING APPARATUS

(75) Inventors: Takahiro Kaihotsu, Kanagawa (JP); Shozo Asai, Saitama (JP)

(73) Assignee: Canon Components, Inc., Saitama (JP)

( * ) Notice: Subject to any disclaimer, the term of this patent is extended or adjusted under 35 U.S.C. 154(b) by 295 days.

(21) Appl. No.: 12/853,885

(22) Filed: Aug. 10, 2010

(65) Prior Publication Data

US 2010/0320928 A1    Dec. 23, 2010

Related U.S. Application Data

(63) Continuation-in-part of application No. PCT/JP2008/063839, filed on Aug. 1, 2008.

(30) Foreign Application Priority Data

| Feb. 13, 2008 | (JP) | 2008-031470 |
| Aug. 11, 2009 | (JP) | 2009-186880 |
| Mar. 5, 2010 | (JP) | 2010-049662 |

(51) Int. Cl.
    *H05B 37/00*    (2006.01)
(52) U.S. Cl.
    USPC ........... 315/291; 315/112; 315/308; 315/224; 315/312
(58) Field of Classification Search
    USPC .............. 315/10, 11.5, 32, 50, 112, 117–118, 315/291, 307, 224, 312, 149, 309, 152, 155, 315/159; 362/227, 230–231, 611, 612, 800
    See application file for complete search history.

(56) References Cited

U.S. PATENT DOCUMENTS

| 6,590,233 B2 | 7/2003 | Sugawara ........................ 257/90 |
| 6,858,456 B2 | 2/2005 | Noguchi et al. ................ 438/26 |
| 6,878,977 B1 | 4/2005 | Kozuka et al. ................ 257/184 |
| 7,151,305 B2 | 12/2006 | Kozuka et al. ................ 257/431 |
| 7,449,666 B2 | 11/2008 | Kaihotsu ........................ 250/205 |
| 2002/0117674 A1 | 8/2002 | Sugawara ........................ 257/79 |

(Continued)

FOREIGN PATENT DOCUMENTS

| JP | 2001-308393 | 11/2001 |
| JP | 2002-134284 | 5/2002 |

(Continued)

OTHER PUBLICATIONS

International Search Report and Written Opinion of the International Searching Authority issued in the counterpart application No. PCT/JP2008/063839 dated Aug. 26, 2008—5 pages.

*Primary Examiner* — Shawki Ismail
*Assistant Examiner* — Christopher Lo
(74) *Attorney, Agent, or Firm* — Fitzpatrick, Cella, Harper & Scinto

(57) ABSTRACT

A white light emitting apparatus includes a light source section in which a first white LED that emits white light whose chromaticity deviates to a blue side from a predetermined white region of a CIE chromaticity diagram and a second white LED that emits white light whose chromaticity deviates to a yellow side from the predetermined white region are adjacently disposed so as to emit light with optical axes in substantially the same direction, and a current regulator that independently drives the blue LED chip in the first and second white LEDs, respectively. A color mixture of lights emitted from the first and second white LEDs is adjusted to a chromaticity of the predetermined white region using the current regulator.

11 Claims, 26 Drawing Sheets

(56) References Cited

U.S. PATENT DOCUMENTS

| | | | |
|---|---|---|---|
| 2004/0090161 A1 | 5/2004 | Noguchi et al. | 313/152 |
| 2006/0158881 A1* | 7/2006 | Dowling | 362/231 |
| 2007/0115662 A1* | 5/2007 | Roberts et al. | 362/252 |
| 2007/0145233 A1 | 6/2007 | Kaihotsu | 250/205 |
| 2008/0106895 A1* | 5/2008 | Van De Ven et al. | 362/231 |
| 2008/0191643 A1* | 8/2008 | Roberts et al. | 315/300 |
| 2009/0122230 A1 | 5/2009 | Ochiai | 349/65 |
| 2009/0201675 A1 | 8/2009 | Onishi et al. | 362/223 |

FOREIGN PATENT DOCUMENTS

| | | |
|---|---|---|
| JP | 2002-2252371 | 9/2002 |
| JP | 2003-060239 | 2/2003 |
| JP | 2004-119743 | 4/2004 |
| JP | 2006-021568 | 1/2006 |
| JP | 2006-128456 | 5/2006 |
| JP | 2006-287923 | 10/2006 |
| JP | 2006-303373 | 11/2006 |
| JP | 2007-066969 | 3/2007 |
| JP | 2007-227681 | 9/2007 |
| JP | 3990437 | 10/2007 |
| JP | 2008-226473 | 9/2008 |
| JP | 2009-021158 | 1/2009 |
| JP | 2009-123489 | 6/2009 |
| WO | WO 2006/087660 A1 | 8/2006 |

* cited by examiner

F I G. 1
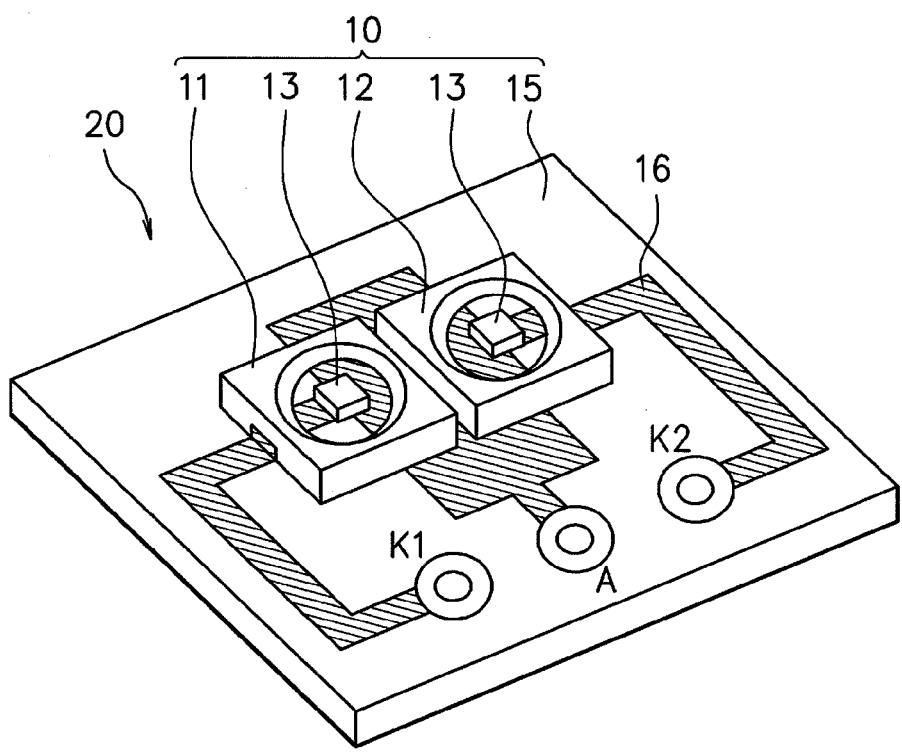

F I G. 2
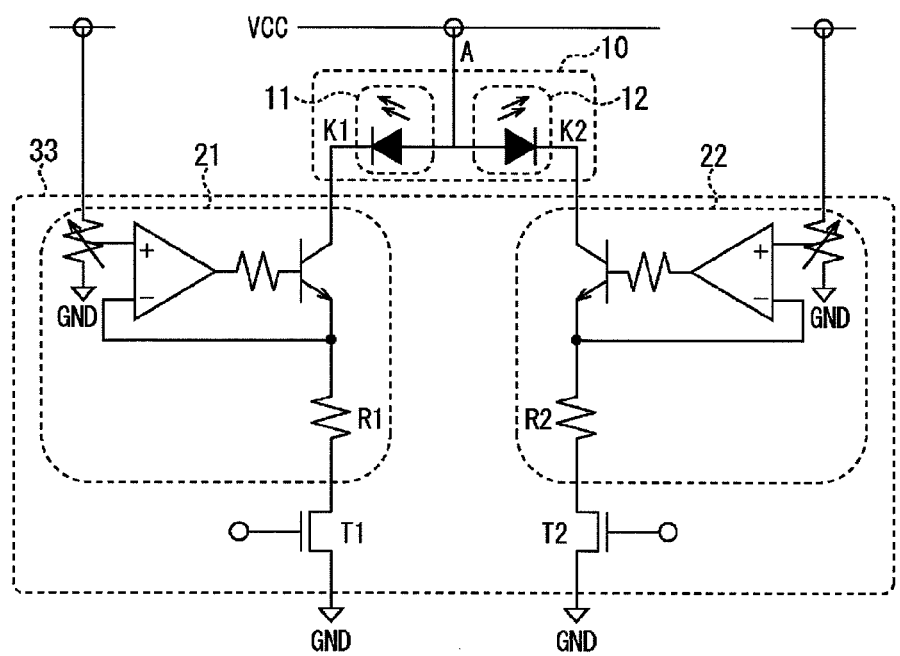

F I G. 3
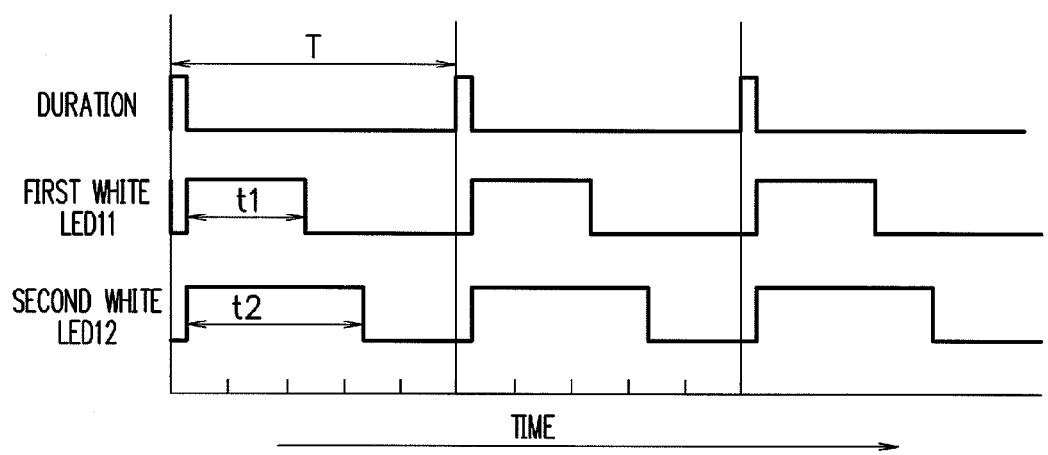

| RANK | x | y |
|---|---|---|
| a0 | 0.280 | 0.248 |
|  | 0.264 | 0.267 |
|  | 0.283 | 0.305 |
|  | 0.296 | 0.276 |
| b1 | 0.287 | 0.295 |
|  | 0.283 | 0.305 |
|  | 0.330 | 0.360 |
|  | 0.330 | 0.339 |
| b2 | 0.296 | 0.276 |
|  | 0.287 | 0.295 |
|  | 0.330 | 0.339 |
|  | 0.330 | 0.318 |
| c0 | 0.330 | 0.318 |
|  | 0.330 | 0.360 |
|  | 0.361 | 0.385 |
|  | 0.356 | 0.351 |

| RANK | x | y |
|---|---|---|
| AA | 0.280 | 0.248 |
|  | 0.264 | 0.267 |
|  | 0.273 | 0.286 |
|  | 0.288 | 0.262 |
| AB | 0.288 | 0.262 |
|  | 0.273 | 0.286 |
|  | 0.283 | 0.305 |
|  | 0.296 | 0.276 |
| B3 | 0.287 | 0.295 |
|  | 0.283 | 0.305 |
|  | 0.304 | 0.330 |
|  | 0.307 | 0.315 |
| B4 | 0.307 | 0.315 |
|  | 0.304 | 0.330 |
|  | 0.330 | 0.360 |
|  | 0.330 | 0.339 |
| B5 | 0.296 | 0.276 |
|  | 0.287 | 0.295 |
|  | 0.307 | 0.315 |
|  | 0.311 | 0.294 |
| B6 | 0.311 | 0.294 |
|  | 0.307 | 0.315 |
|  | 0.330 | 0.339 |
|  | 0.330 | 0.318 |
| C0 | 0.330 | 0.318 |
|  | 0.330 | 0.360 |
|  | 0.361 | 0.385 |
|  | 0.356 | 0.351 |

F I G. 7A
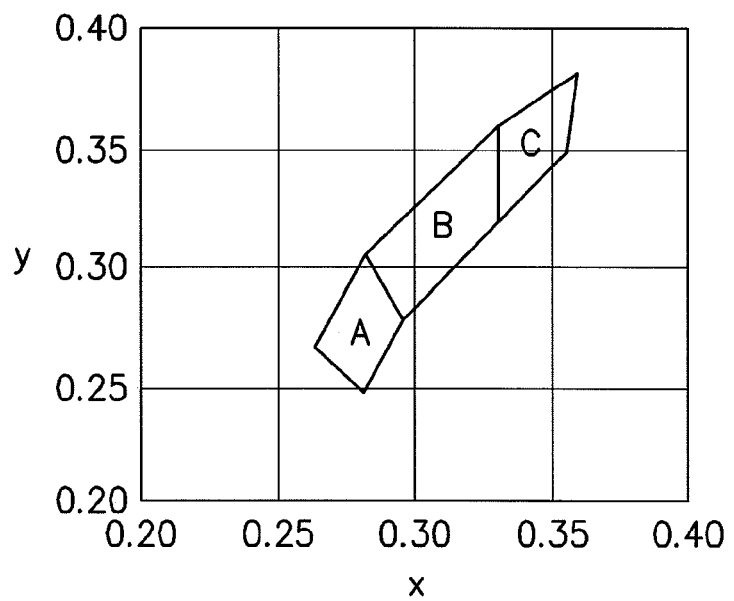
F I G. 7B
| RANK | x | y |
|---|---|---|
| A REGION | 0.280 | 0.248 |
|  | 0.264 | 0.267 |
|  | 0.283 | 0.305 |
|  | 0.296 | 0.276 |
| B REGION | 0.296 | 0.276 |
|  | 0.283 | 0.305 |
|  | 0.330 | 0.360 |
|  | 0.330 | 0.318 |
| C REGION | 0.330 | 0.318 |
|  | 0.330 | 0.360 |
|  | 0.361 | 0.385 |
|  | 0.356 | 0.351 |

F I G. 9
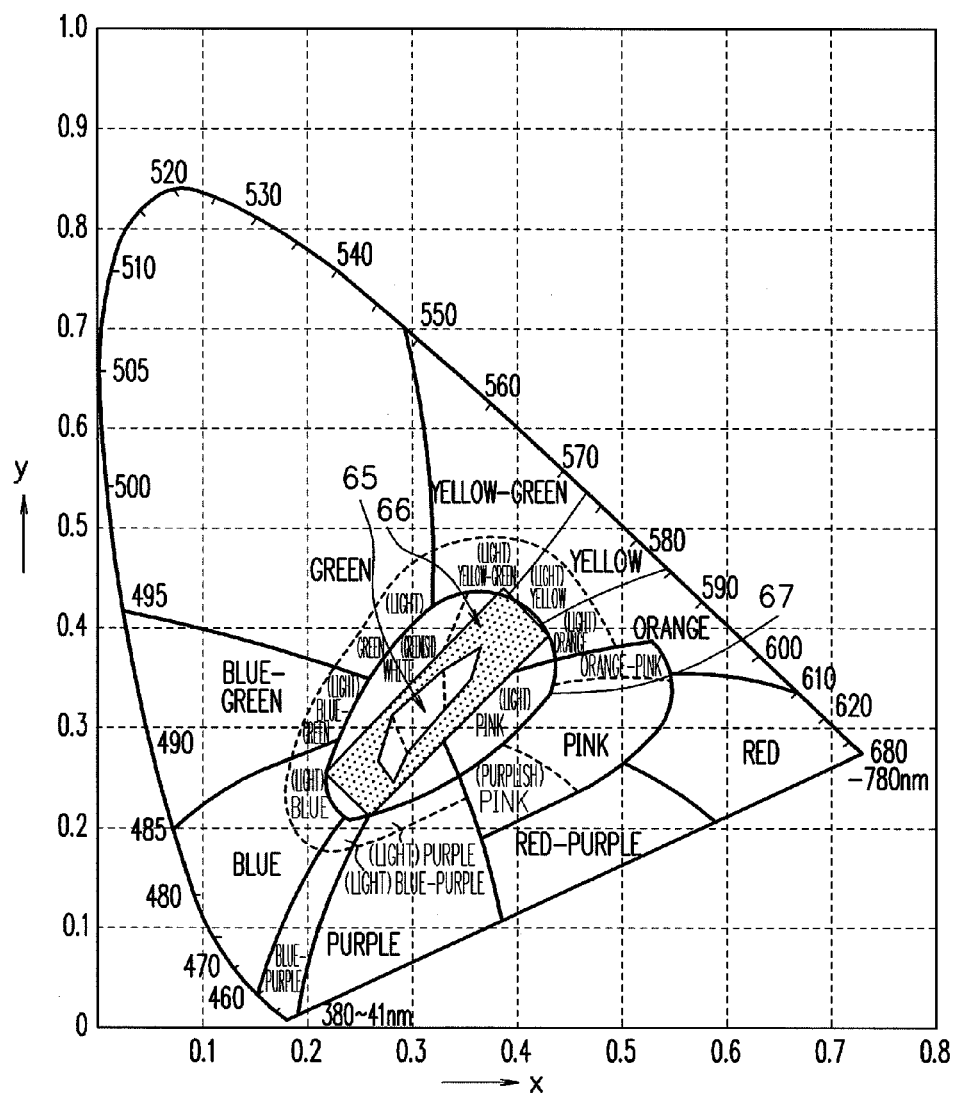

F I G. 10
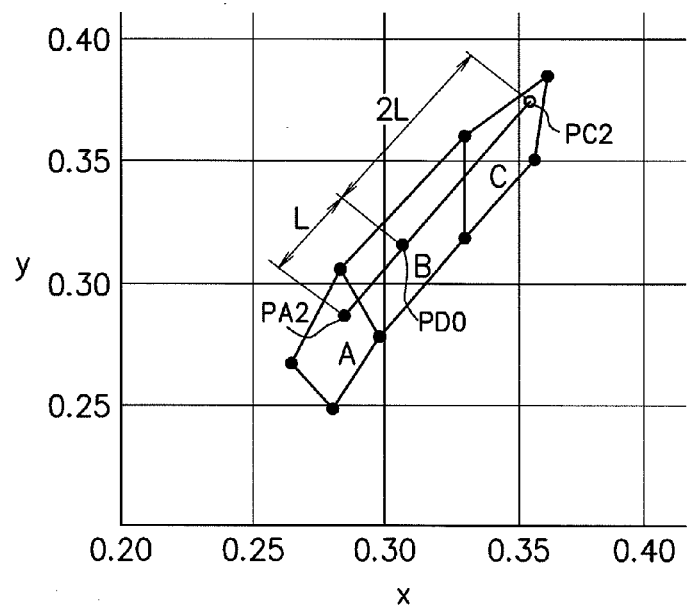
F I G. 11
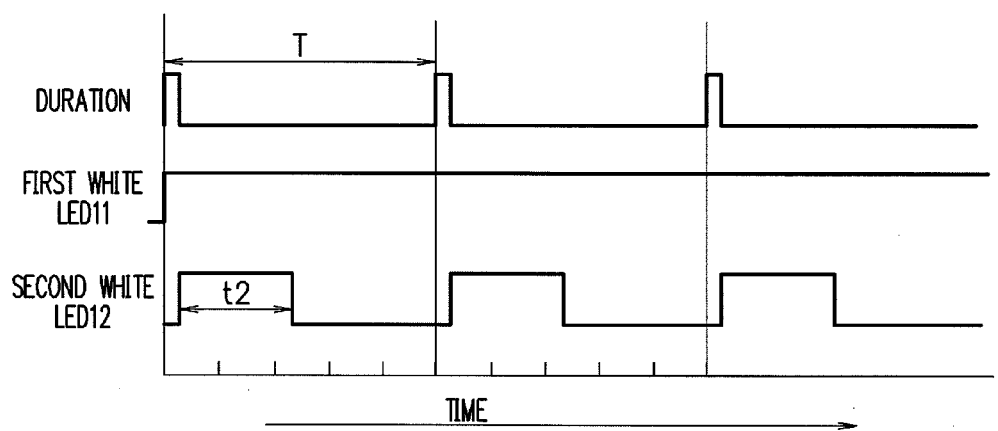

F I G. 12
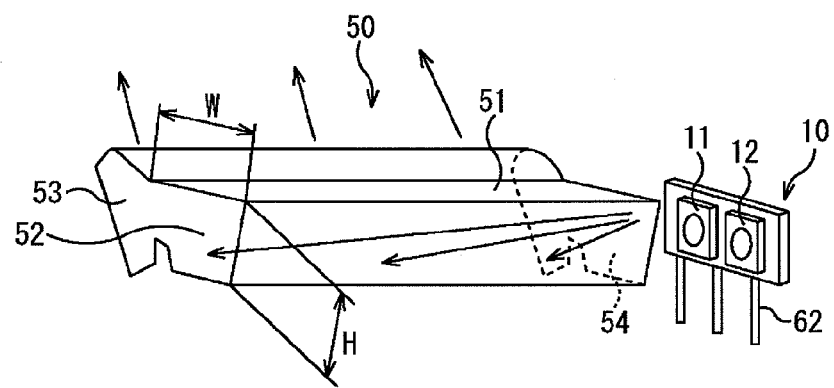

F I G. 13
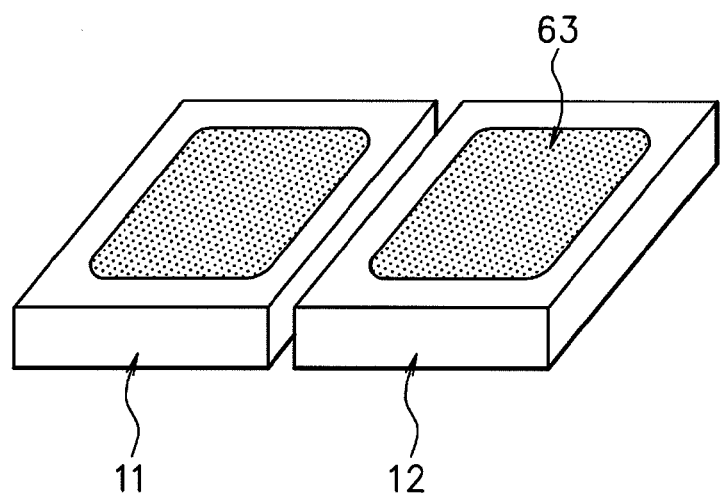

F I G. 14
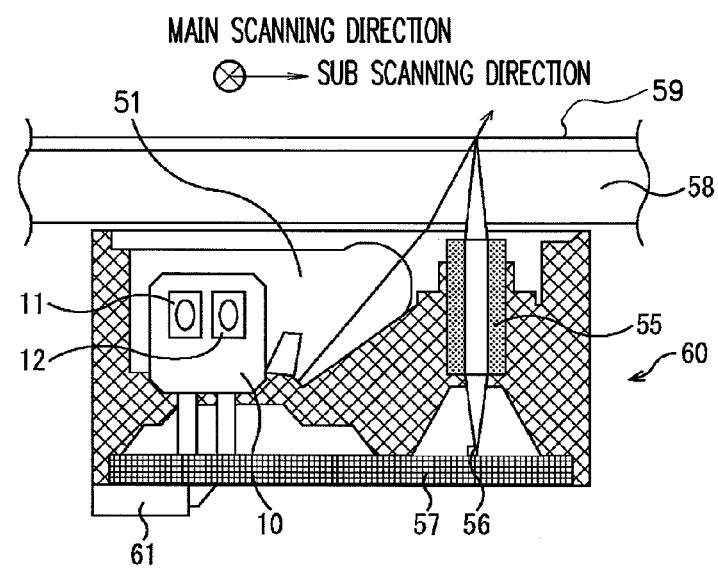

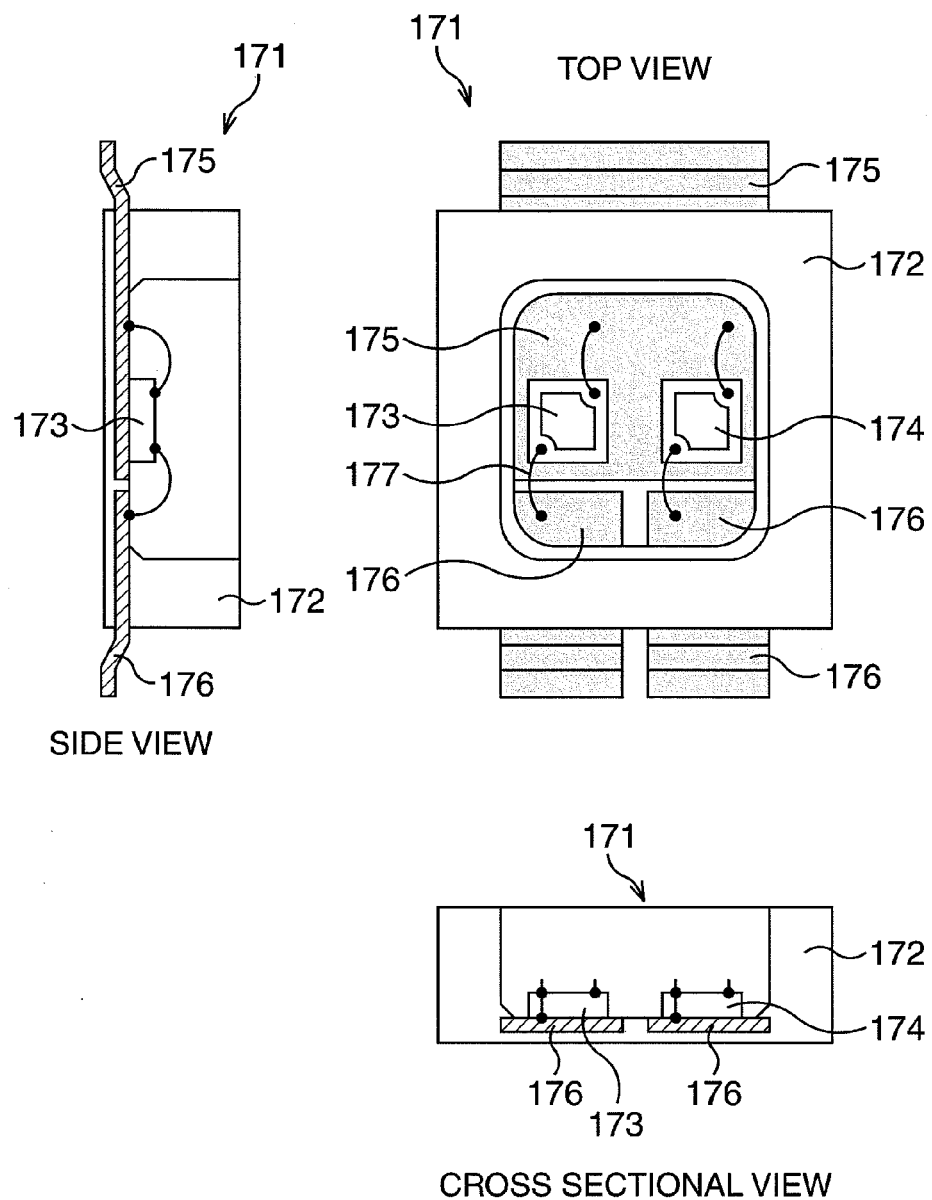

WHITE LIGHT EMITTING APPARATUS AND LINE ILLUMINATOR USING THE SAME IN IMAGE READING APPARATUS

CROSS-REFERENCE TO RELATED APPLICATIONS

This is a continuation-in-part application of International Application No. PCT/JP2008/063839, with an international filing date of Aug. 1, 2008, which designating the United States of America, the entire contents of which are incorporated herein by reference.

This application is based upon and claims the benefit of priority of the prior Japanese Patent Application No. 2008-031470, filed on Feb. 13, 2008, the Japanese Patent Application No. 2009-186880, filed on Aug. 11, 2009, and the Japanese Patent Application No. 2010-049662, filed on Mar. 5, 2010, the entire contents of which are incorporated herein by reference.

TECHNICAL FIELD

The present invention relates to a white light emitting apparatus and a line illuminator that uses the white light emitting apparatus in an image reading apparatus. In particular, the present invention relates to a white light emitting apparatus on which a white LED is mounted and a line illuminator that uses the white light emitting apparatus, that are used in an image reading apparatus.

BACKGROUND ART

In a machine such as a fax machine, a copier, or a hand scanner, an image reading apparatus such as an image sensor is used as an apparatus for reading an original copy. Normally, a contact-type image sensor that has a short optical path length and that can be easily incorporated into the machine is used as this kind of image reading apparatus.

A contact-type image sensor is equipped with a line illuminator that linearly illuminates an original copy surface across a main scanning area. As a line illuminator, an indirect illumination-type line illuminator is known that uses a long light guide member and that propagates a light incident from a light source disposed at an end surface of the light guide member while causing the light to be reflected by an inner surface to emit the light from a linear emitting surface in a longitudinal direction.

It is known that a white LED that includes a blue LED chip and a YAG phosphor can be used as a light source in this kind of line illuminator. A white LED light source is capable of reading color images, and lighting control thereof is simpler in comparison to a multi-chip LED that emits light of the three colors red, green and blue (RGB). Further, it is said that a white LED light source is superior in terms of brightness characteristics and with respect to miniaturization and weight reduction, and also enhances light emission efficiency when employed as the light source of a contact-type image sensor.

Further, users desire that in a line illuminator in which an LED including a plurality of light emitting elements is disposed as a light source at an end surface of a light guide member, emitted light colors from the plurality of chips are released after being sufficiently mixed in the light guide member without disturbing the color balance, and illuminate a color original copy as linear illumination with a homogeneous hue. An invention for solving these problems or that has a feature relating to the shape of a light guide member is disclosed in Patent Document 1 and the other documents.

Further, Patent Document 2 discloses that when white LEDs are mass produced, considerable variations arise with respect to the light emission wavelength and light emission brightness of blue LED chips. Furthermore, white light that is mixed is also affected by variations in the amount and dispersion of fluorescent particles of YAG phosphor that get mixed in with a covering member and the like, and it is considered that, as a result, large variations arise in the hue and brightness of completed white LEDs.

The distribution of variations in the hue of emitted lights of white LEDS that were mass produced in lots will now be described referring to FIG. 16 using one section of the chromaticity coordinates thereof. The distribution chart shown in FIG. 16 is disclosed in Patent Document 2. Each black spot illustrated in FIG. 16 represent individual hue data of a white LED, and the hue is dispersed in a band shape that slopes upward to the right as illustrated in FIG. 16. More specifically, the hue is dispersed in a band shape in a white region that falls approximately on a line that passes from blue through yellow via a white point according to the chromaticity classification of JIS Z 8110. In this case, the dispersion in the width direction (represented by the arrowed line A) is mainly due to hue variations caused by variations in the light emission wavelength of blue light emitting elements, and the dispersion in the longitudinal direction (represented by the arrowed line B) is mainly due to hue variations caused by variations in the amount or dispersion of fluorescent particles that have gotten mixed into the covering member. In this connection, since the light emission wavelength of blue light emitting elements varies significantly between lots, the dispersion in the width direction (represented by the arrowed line A) spreads further in actual mass production (see Patent Document 2).

In this case, when attempting to construct a light source of a line illuminator for an image reading apparatus using such kind of white LED, it is preferable from the viewpoint of the central hue and hue unevenness and the like that the light source is constructed using only white LEDs that have been selected by ranking the emitted light colors thereof in a desired chromaticity range. However, when a light source is constructed using only white LEDs that have a specific ranking, white LEDs with a different ranking are wasted, and there is thus the problem that the total cost for obtaining the white LEDs is comparatively high.

[Patent Document 1] Japanese Laid-Open Patent Publication No. 2006-287923

[Patent Document 2] Japanese Laid-Open Patent Publication No. 2004-119743

[Patent Document 3] Japanese Patent No. 3990437

[Patent Document 4] Japanese Laid-Open Patent Publication No. 2002-134284

[Patent Document 5] Japanese Laid-Open Patent Publication No. 2007-066969

[Patent Document 6] Japanese Laid-Open Patent Publication No. 2006-303373

SUMMARY OF THE INVENTION

The present invention has been made in view of the above described conventional problems, and provides a white light emitting apparatus constructed by combining white LEDs that emit lights with degrees of whiteness over a wide range that deviate from a desired degree of whiteness, and that mixes the emitted light colors to emit light with a desired chromaticity, as well as a line illuminator that uses the white light emitting apparatus. An object of the present invention is to improve yields of white LEDs and lower the cost of producing a white light emitting apparatus by increasing the usability of white LEDs that have a wide range of chromaticities.

A white light emitting apparatus for an image reading apparatus according to the present invention uses a white LED having a blue LED chip and a phosphor, and includes a light source section in which a first white LED that emits white light whose chromaticity deviates to a blue side from a predetermined white region of a CIE chromaticity diagram and a second white LED that emits white light whose chromaticity deviates to a yellow side from the predetermined white region are adjacently disposed such that optical axes thereof are in substantially the same direction, and a current regulator that independently drives the blue LED chips in the first and second white LEDs, respectively; wherein the current regulator performs PWM control for a drive current of at least one of the first and second white LEDs, and by setting respective pulse widths for driving the first and second white LEDs that are inversely proportional to a distance from a target chromaticity point to a chromaticity point of emitted light of the first white LED and a distance from the target chromaticity point to a chromaticity point of emitted light of the second white LED on a CIE chromaticity diagram, adjusts a color mixture of lights emitted from the first and second white LEDs to a chromaticity of the predetermined white region.

A white light emitting apparatus for an image reading apparatus according to the present invention uses a white LED having a blue LED chip and a phosphor, and includes a light source section in which a first white LED that emits white light whose chromaticity deviates to a blue side from a predetermined white region of a CIE chromaticity diagram and a second white LED that emits white light whose chromaticity deviates to a yellow side from the predetermined white region are adjacently disposed such that optical axes thereof are in substantially the same direction, and a current regulator that independently drives the blue LED chips in the first and second white LEDs, respectively; wherein the current regulator continuously supplies a constant current to one white LED among the first and second white LEDs that emits white light whose chromaticity is nearer to a target chromaticity point on the CIE chromaticity diagram, and supplies a PWM-controlled current to another white LED among the first and second white LEDs, sets a duty ratio of the PWM control to a value of an inverse ratio between a distance between a chromaticity of the one white LED and the target chromaticity point and a distance between a chromaticity of the other white LED and the target chromaticity point on the CIE chromaticity diagram, and adjusts a color mixture of emitted lights from the first and second white LEDs to a chromaticity of the predetermined white region.

A line illuminator according to the present invention is configured to emit light that is incident from a light source disposed toward a light incident surface provided at an end surface in a length direction of a bar-shaped light guide member formed of a clear member from a light emitting surface provided along a length direction while causing the light to be reflected by an inner surface of the bar-shaped light guide member. The light source is the above described white light emitting apparatus.

According to the line illuminator of the present invention, an external shape of a radiating surface that radiates a light of the white light emitting apparatus is of dimensions that can be included in an external shape of the light incident surface of the light guide member.

According to the white light emitting apparatus of the present invention, by using a combination of white LEDs that emit light colors whose chromaticity deviates from a predetermined white region among ranked white regions that are being provided as products, it is possible to utilize white LEDs that have a wide range of chromaticities. More specifically, the white light emitting apparatus of the present invention lowers the cost of producing white LEDs by reducing the number of products that have heretofore been wasted due to hue deviations that are inherent to white LEDs that include a blue LED chip and a YAG phosphor.

Further, according to the white light emitting apparatus of the present invention, it is possible to emit light of a predetermined white region that is a target without employing a complicated configuration that has been used in the conventional technology such as newly adding a LED chip that emits light of a different wavelength or a different kind of fluorescent substance, or changing the phosphor composition in order to compensate for chromaticity variations that are a drawback of white LEDs.

Further, for example, by using the white light emitting apparatus according to the present invention as a light source of a line illuminator, a bright line illuminator that illuminates with a prescribed white chromaticity can be economically produced.

BRIEF DESCRIPTION OF THE DRAWINGS

FIG. 1 is a perspective diagram illustrating a light source section of a white light emitting apparatus according to a First Embodiment of the present invention;

FIG. 2 is a diagram illustrating one example of an electrical circuit for driving the white light emitting apparatus according to the First Embodiment of the present invention;

FIG. 3 is a diagram for describing control of the illumination duration of two white LEDs according to the First Embodiment of the present invention;

FIG. 7A is a view in which the chromaticity of emitted lights of commercially available white LED products are re-ranked into areas A, B, and C and represented on a CIE chromaticity diagram;

FIG. 7B is a view that illustrates coordinate values of each angle of the areas A, B, and C that have been re-ranked as illustrated in FIG. 7A;

FIG. 9 is a view for describing a white light emitting apparatus used as a first or second white LED that emits light with a chromaticity in a band region that is outside a ranked white region;

FIG. 10 is a view for describing the chromaticity of light emitted by a white light emitting apparatus of a Second Embodiment according to the present invention;

FIG. 11 is a diagram for describing control of the illumination duration of two white LEDs of the Second Embodiment according to the present invention;

FIG. 12 is a perspective diagram illustrating the configuration of a line illuminator of a Third Embodiment according to the present invention;

FIG. 13 is a view for describing a radiating surface of a white light emitting apparatus used for a light source of the line illuminator of the Third Embodiment according to the present invention;

FIG. 14 is a view that illustrates a cross section of a CIS unit that incorporates the line illuminator of the Third Embodiment according to the present invention;

FIG. 25A is a diagram illustrating a method for manufacturing a white light emitting diode according to a sixth embodiment of the present invention (a configuration before a fluorescent layer is formed);

DETAILED DESCRIPTION OF THE PREFERRED EMBODIMENTS

The present invention was completed based on the study of properties of a white LED having a blue LED chip and a fluorescent substance by the inventor of the present application, the study of a white light emitting apparatus and an illuminator for emitting white light that emit a high-power light having a uniform degree of whiteness, and a novel finding of a configuration of these which is easy to manufacture.

Figure 4:
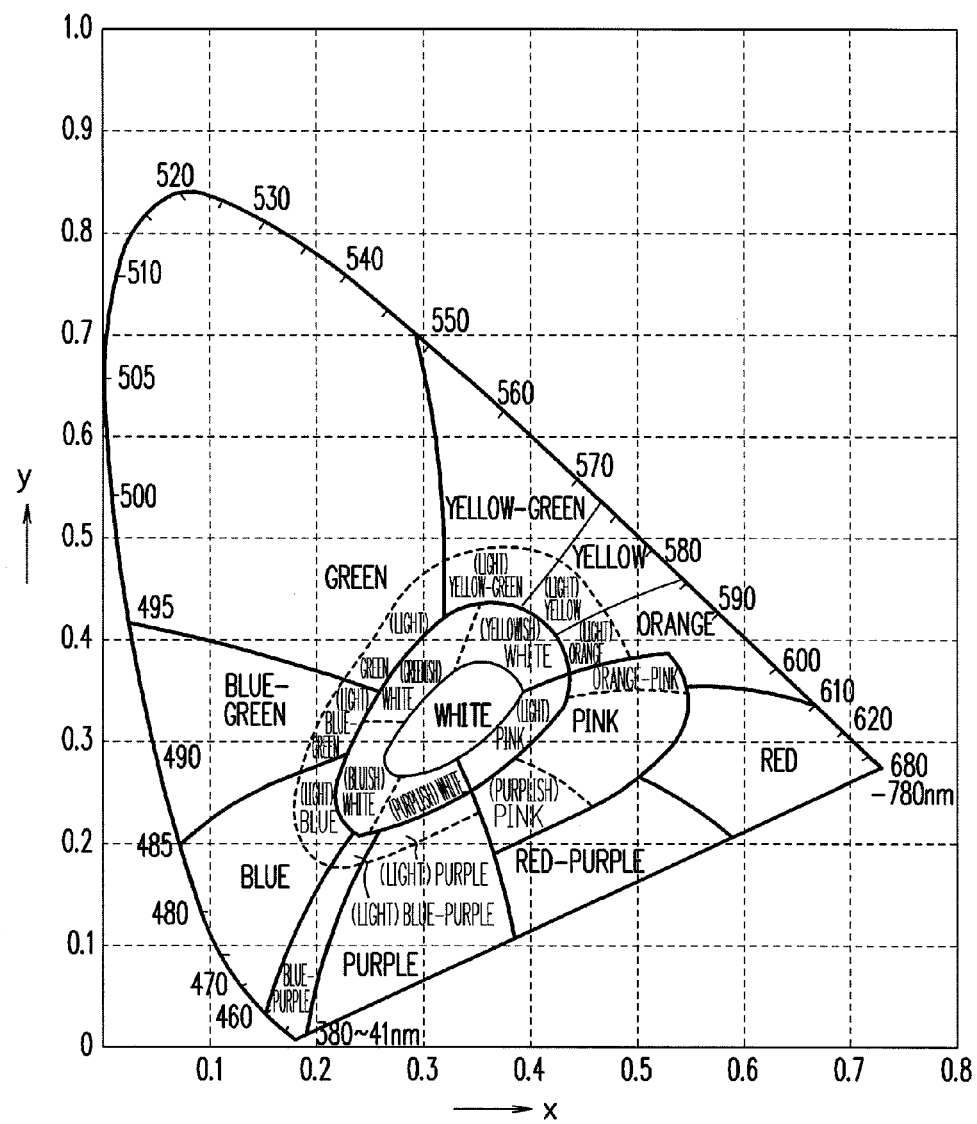
FIG. 4 is a view for describing a typical white region using chromaticity coordinates according to JIS Z 8110.

In this connection, white colors as illumination light sources in the present embodiment are typically defined as in reference FIG. 1 "General Chromaticity Classification of System Color Names" of JIS Z 8110 in the Japanese Industrial Standards as illustrated in FIG. 4. Among these, the white colors are classified into white, (bluish) white, (purplish) white, (yellowish) white, (greenish) white and (light) pink. These colors are referred to as a typical "white color" according to the present invention.

A process whereby a mixture ratio of light is adjusted so that colors of illumination light sources become a target white color is referred to as "white balance". This adjustment is performed using a measurement sensor device. According to the present embodiment a spectrophotometer is used, and the luminosity, brightness, chromaticity, and x and y coordinates on a CIE chromaticity diagram and the like of a white LED is measured or calculated. However, the present invention may also be implemented satisfactorily even when the white balance is adjusted using a measurement sensor device other than a spectrophotometer.

Figures 5A, 5B:
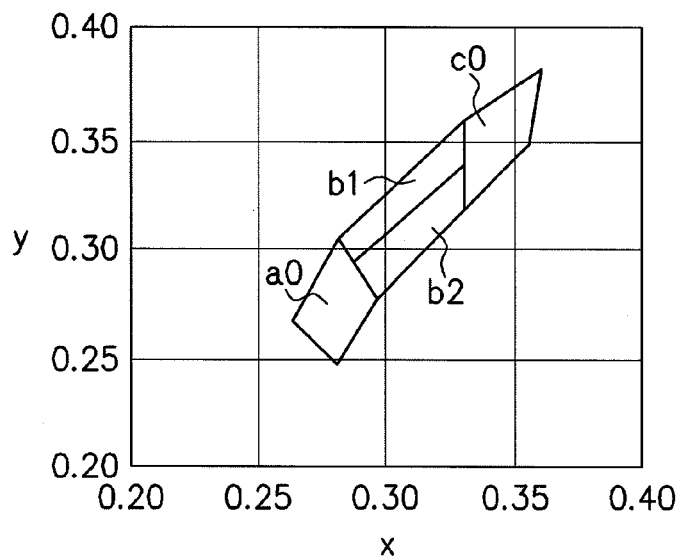
FIG. 5A is a view that illustrates an example in which light emission regions of white LEDs produced by one manufacturer are divided into four ranks and represented on a CIE chromaticity diagram.
FIG. 5B is a view that illustrates coordinate values of angles of each area generated by the division of light emission regions into ranks illustrated in FIG. 5A.
Figures 6A, 6B:
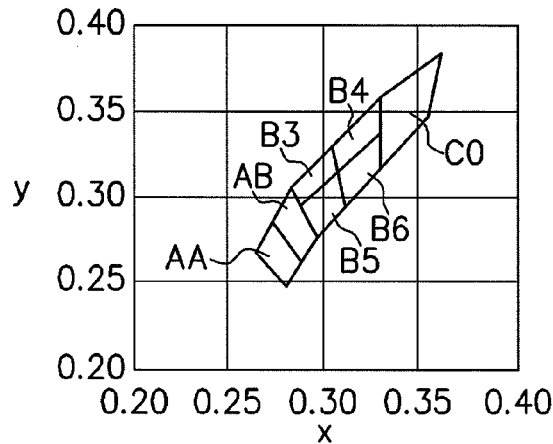
FIG. 6A is a view that illustrates an example in which light emission regions of white LEDs produced by one manufacturer are divided into seven ranks and represented on a CIE chromaticity diagram.
FIG. 6B is a view that illustrates coordinate values of angles of each area generated by the division of light emission regions into ranks illustrated in FIG. 6A.

Each manufacturer of white LEDs ranks regions of a certain width and length in the aforementioned typical white color region including a white point (x=0.33, y=0.33) on the CIE chromaticity diagram as light emission regions of white LEDs that are provided. For example, in the product catalog (fiscal year 2008 edition) of Nichia Corporation (hereunder abbreviated to "N. Corp."), light emission regions are ranked and divided into four regions, namely, a0, b1, b2, and c0, as illustrated in FIG. 5A. The coordinate values of angles of each region are illustrated in FIG. 5B. Further, in the product catalog (2008 edition) for white LEDs of the type made by combining blue LEDs and phosphor of Toyoda Gosei Co. Ltd. (hereunder, abbreviated to "T. Co."), as illustrated in FIG. 6A, light emission regions are ranked and divided into seven regions, namely, AA, AB, B3 to B6, and C0. The coordinate values of angles of each region are illustrated in FIG. 6B. The total region ranked by both companies is identical and overlapping on the CIE chromaticity diagram, and the respective regions only differ at the level of the segmented regions.

Here, to facilitate the description of the present embodiment, these ranked regions are re-ranked into three regions, namely, A, B, and C regions. More specifically, the a0 region of N. Corp. and the (AA+AB) region of T. Co. are the same region (hereunder, referred to as "A region"), the c0 region of N. Corp. and the C0 region of T. Co. are the same region (hereunder, referred to as "C region"), and the (b1+b2) region of N. Corp. and the (B3+B4+B5+B6) region of T. Co. are the same region (hereunder, referred to as "B region"), and are overlapping regions, respectively. The light emission regions re-ranked in this manner are illustrated in FIG. 7A. The A region, B region, and C region illustrated in FIG. 7A are regions for which the chromaticity of emitted lights of commercially available white LED products are ranked. The coordinate values of angles of each region are illustrated in FIG. 7B. According to FIG. 7A, the white point (x=0.33, y=0.33) exists on the boundary between the B region and C region. As illustrated in FIG. 7A, the B region is a region in which the color changes towards blue from the white point.

Hereunder, the (A+B+C) region is referred to as a "ranked white region". Further, the B region is referred to as a "predetermined white region" (desired hue), and is the target hue of an emitted light color of the white light emitting apparatus in the embodiment. Thus, with respect to the ranked white region for which manufacturers have ranked the white light emission of white LEDs, the predetermined white region (B region) is positioned in the centre thereof, and the A region that deviates to the blue side and the C region that deviates to the yellow side from the predetermined white region are regions on the CIE chromaticity diagram that are connected to the predetermined white region (B region). As illustrated in FIG. 7B, the predetermined white region (B region) represents chromaticities inside a region surrounded by four points with the coordinate values (x, y) (0.296, 0.276), (0.283, 0.305), (0.330, 0.360) and (0.330, 0.318) on the CIE chromaticity diagram. Further, the A region represents chromaticities inside a region surrounded by the four points (0.280, 0.248), (0.264, 0.267), (0.283, 0.305), and (0.296, 0.276), and the C region represents chromaticities inside a region surrounded by the four points (0.330, 0.318), (0.330, 0.360), (0.361, 0.385) and (0.356, 0.351).

In an image reading apparatus in which the white light emitting apparatus or line illuminator according to the present invention is used, it is not intended to have the light source or reflected light thereof directly recognized by the human eye, and a mechanism is employed whereby a photoelectric conversion sensor receives and recognizes the light. Accordingly, it is not necessary that the central hue of emitted light colors must always be the white point (x=0.33, y=0.33) on the CIE chromaticity diagram, and the hue of the light source is selected by taking into account the cost efficiency of the light source in an adjustable range of the image reading apparatus.

In this connection, the coordinate values (x=0.307, y=0.315) of a common angle of the regions B3 to B6 shown in FIG. 6A are employed as the coordinates of the center of the B region, and are taken as target coordinate values (target chromaticity point) which the chromaticity should reach in the present embodiment. Accordingly, although constructing a light source of an image reading apparatus that is an object of the present invention using only white LEDs of B region is preferable from the viewpoint that hue unevenness is easily suppressed, in such case white LEDS of the A region and C region are wasted, and this is a problem should be considered from the cost viewpoint.

The present invention provides a white light emitting apparatus or a line illuminator that, with respect to white LEDs that emit light of a chromaticity of a ranked white region provided by a manufacturer, emits light using white LEDs that emit light colors of an A region or a C region that deviate from a predetermined white region (B region), and adjusts the hues of the emitted light colors. As a result, the number of wasted white LEDs is reduced. Specific examples of the invention are described hereunder.

[First Embodiment]

A white light emitting apparatus used in an image reading apparatus according to the First Embodiment is provided with two white LEDs. Each of the white LEDs includes a blue LED chip, and a phosphor layer which is excited by a radiation light emitted by the blue LED chip and emits a yellow light. Yellow is a complementary color of blue. In the First Embodiment, a white light emitting apparatus 20 having two white LEDs will be explained with reference to FIGS. 1 to 4, and FIG. 9.

The white light emitting apparatus 20 of the present embodiment includes a light source section 10 and a current regulation section 33. FIG. 1 illustrates the light source section 10 of the white light emitting apparatus 20. The light source section 10 includes a first white LED 11 for emitting a white light of A region which deviates to the blue side from the predetermined white region (B region) among the aforementioned ranked white region (A region+B region+C region) and a second white LED 12 for emitting a white light of C region which deviates to the yellow side from the predetermined white region (B region), with the first and second LEDs 11 and 12 being adjacently mounted to a printed circuit board 15. The first and second white LEDs 11 and 12 are also adjacently arranged to emit light such that the principal light-emitting directions thereof, that is, the optical axes, are parallel to each other in approximately the same direction. The printed circuit board 15 is provided with an anode line which is common to the two white LEDs 11 and 12 and two cathode lines connected to each of the white LEDs 11 and 12 as wiring 16 for electric supply. The anode line and the two cathode lines are connected to an external current regulation section 33 through terminals A, K1, and K2, respectively (see FIG. 2). The current regulation section 33 causes the first and second white LEDs 11 and 12 constituting the light source section 10 of the white light emitting apparatus 20 to be driven independently. In this connection, the phosphor layer covering the blue LED chip is omitted from FIG. 1.

As the white LEDs used in this embodiment, for example, white LEDs for which the hues of emitted lights are in the A region and the C region may be designated and acquired. Each of these kinds of white LED is a commercially available surface mount LED package having a longitudinal dimension of about 2.0 mm and a lateral dimension of about 1.2 mm (NESW007A, manufactured by Nichia Corporation). Further, it is possible to acquire the white LEDs with the aforementioned product number and, from among those, identify and use white LEDs that emit light of the A region and white LEDs that emit light of the C region in a lighting state with a rated forward current of 10 mA by means of the aforementioned measurement sensor device.

The white light emitting apparatus according to the present invention is an apparatus that attempts to obtain the chromaticity of B region by mixing the white lights of two white LEDs. That relationship is described next referring to a CIE chromaticity diagram illustrated in FIG. 8. The coordinate values of angles of each region are the same as in FIG. 7B. In this case, the white light emitting apparatus includes a first white LED that emits a white light LA1 at a chromaticity point PA1 in A region on the CIE chromaticity diagram illustrated in FIG. 8, and a second white LED that emits a white light LC1 at a chromaticity point PC1 in C region illustrated in FIG. 8.

Figure 8:
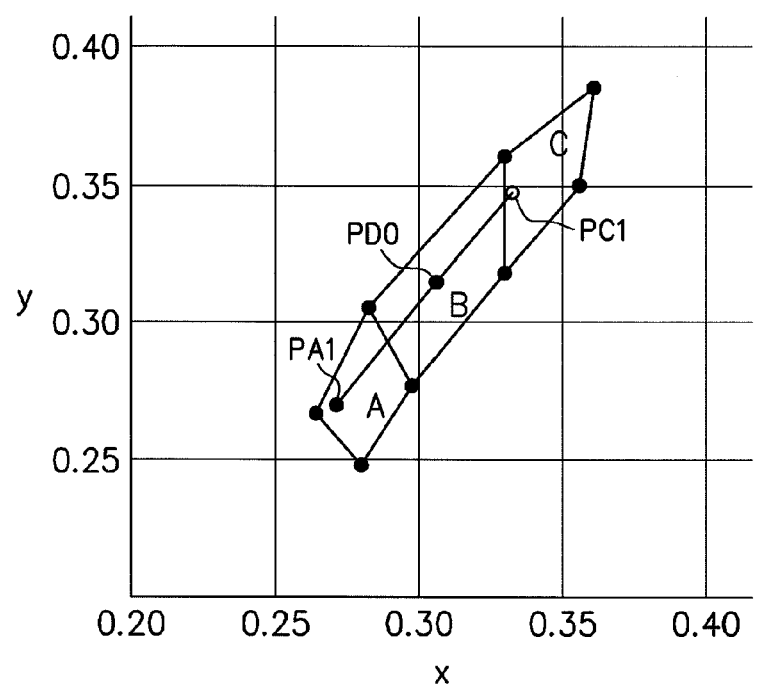
FIG. 8 is a chromaticity diagram that describes control that mixes colors of lights emitted from two white LEDs of the white light emitting apparatus according to the First Embodiment of the present invention.

In order to cause a color mixture produced by the emitted light colors of the first and second white LEDs to match a point PD0 illustrated in FIG. 8, the luminosity of the white light LA1 at the point PA1 and the luminosity of the white light LC1 at the point PC1 may be weighted, and the luminosity may be adjusted so that a value that is a weighted average between the chromaticity coordinates of the point PA1 and the chromaticity coordinates of the point PC1 becomes a value with predetermined chromaticity coordinates. The point PD0 is a target point which the color mixture should reach that is taken to have the coordinate values (x=0.307, y=0.315), and these coordinates are the center of the aforementioned B region.

Adjustment of the luminosity (brightness) of emitted light colors of the white LEDs of the present embodiment is performed with PWM control that keeps a forward current that drives each LED chip constant and changes the pulse width, which is recommended because there are few hue changes.

Next, a method of adjusting a color mixture in the white light emitting apparatus 20 of the present embodiment is described. FIG. 2 is a diagram illustrating one example of an electrical circuit for driving the white light emitting apparatus 20. The electrical circuit includes the light source section 10 and a current regulation section 33 that is a current regulator. The light source section 10 corresponds to the part illustrated in FIG. 1. The current regulation section 33 includes current regulation sections that are separately provided to control currents flowing to each of the first and second white LEDs 11 and 12. For example, current regulating circuits 21 and 22 are connected in parallel to each of the first and second white LEDs 11 and 12 via two cathode terminals K1 and K2 of the light source section 10, respectively. Also, transistors T1 and T2 for turning each of the white LEDs 11 and 12 on and off are connected to the current regulating circuits 21 and 22, respectively. The transistors T1 and T2 are connected to ground GND.

Each of the current regulating circuits 21 and 22 are, for example, provided with an operation amplifier, a transistor, and a current-limiting resistor R1 or R2. The current regulation section 33 causes a forward current that is defined for each of the white LEDs 11 and 12 to be applied to each of the white LEDs 11 and 12, and turns the transistors T1 and T2 on and off, respectively, by a PWM control method so as to control the lighting of the white LEDs 11 and 12. Such current regulation section 33 functions as a current regulator.

Next, the current control operation for causing emitted light colors that have been mixed by the white light emitting apparatus 20 of the present embodiment to substantially match a target point that should be reached on a chromaticity diagram will be described. FIG. 3 is a timing chart for performing PWM control with respect to an illumination duration of the first and second white LEDs 11 and 12.

First, the white light emitting apparatus 20 is operated with a duration of pulse T being set to be 10 milliseconds, a current for driving the first and second white LEDs 11 and 12 being set to be a rated 10 mA using the current regulating circuits 21 and 22, and an illumination duration t1 of the first white LED 11 being set to be 5 milliseconds for each cycle. The drive currents of the white LEDs 11 and 12 are set by the current regulating circuits 21 and 22, respectively, and the illumination duration t1 is controlled by the transistor T1.

Next, a measurement sensor device is installed at a position above the light emitting surface of the white light emitting apparatus 20 that is separated from the two white LEDs 11 and 12 by a distance such that the emitted lights are sufficiently mixed with each other, or over a scattering plate that has been arranged, and chromaticity measurement of emitted light colors of the white light emitting apparatus 20 is started. In this case, chromaticity measurement is started with a measurement time being set to be several tens of times or more greater than the duration T.

Thereafter, an illumination duration t2 of the white LED 12 for each cycle is controlled by the transistor T2, to find an illumination duration t2 for which a chromaticity measurement value of light emitted by the white light emitting apparatus 20 approximately matches the point PD0 (x=0.307, y 0.315) at the center of the B region illustrated in FIG. 8.

In this case, in order to make the chromaticity of an emitted light color that has been mixed by the white light emitting apparatus 20 approximately match the point PD0 that has coordinate values at approximately the center of the B region that is taken as the target on the CIE chromaticity diagram, the PWM control by the current regulation section 33 may be used to cause the first white LED 11 to light in accordance with a duty ratio D1=t1/T and cause the second white LED 12 to light in accordance with a duty ratio D2=t2/T.

In this connection, depending on the coordinates position inside the A region corresponding to the emitted light color of the first white LED or the coordinates position inside the C region corresponding to the emitted light color of the second white LED that have been selected, it may not be possible to match the color mixture with the point PD0. However, since it is possible to match the color mixture with a chromaticity inside the B region, it is possible to satisfactorily solve the problem to be solved by the present invention. Further, the entire ranked white region includes the A region+B region+C region that are connected in an arch shape. Hence, when a white LED is selected that emits light whose chromaticity is on the inner side of a far end of the arch shape in the A region or C region, in some extremely rare cases the chromaticity coordinates of the color mixture may deviate outside the B region. In such case, it is sufficient to determine whether the chromaticity of the color mixture is allowable or not.

In contrast to the conventional white light emitting apparatus that suppresses the occurrence of color unevenness by selecting only white LEDs that emit light of a predetermined white region that is comparatively narrow, the white light emitting apparatus according to the present invention also combines and uses white LEDs that emit light colors whose chromaticity deviates from a predetermined white region in ranked white regions that are being provided as products. Consequently, according to the present invention, the product cost can be lowered by reducing the number of white LEDs that heretofore have been screened and not used due to hue deviations that are inherent to white LEDs that include a blue LED chip and a YAG phosphor.

Further, according to the present invention, it is possible to manufacture a white light emitting apparatus that can emit light of a target predetermined white region without employing a complicated configuration that has been used in the conventional technology such as newly adding an LED chip that emits light of a different wavelength or a different kind of fluorescent substance, or changing the phosphor composition in order to compensate for chromaticity variations that are a drawback of white LEDs.

As the current control in the white light emitting apparatus 20, instead of the control with the PWM method, the amounts of currents for driving the white LEDs 11 and 12 may be controlled. The amounts of currents can be controlled by the current regulating circuits 21 and 22. Alternatively, the control with the PWM method and the control of the current amounts may be combined.

According to the above embodiment, the chromaticity of light emitted by white LEDs is described based on ranked white regions provided by manufacturers. However, with respect to the distribution of the chromaticity of light emitted from white LEDs including a blue LED chip and a YAG phosphor, the chromaticity can also be distributed in a white region between a light emission region of blue of a blue LED chip and a yellow region of light emitted by a phosphor on the CIE chromaticity diagram. This white region is represented by a band region 66 illustrated in FIG. 9. The typical white region 67 according to reference FIG. 1 (see FIG. 9) of the standard JIS Z 8110 that is previously defined spreads to outside the ranked white region (A region+B region+C region) 65, and is an ellipsoidal region with a longitudinal diameter that is approximately a distance from a point ($x=0.23$, $y=0.21$) on a blue side with respect to the white point in the CIE chromaticity diagram to a point ($x=0.41$, $y=0.41$) on a yellow side thereof. The present invention can also be used for a white LED for which a chromaticity distributed by the emitted light color of the white LED is in the band region 66 within the typical white region 67.

A white light emitting apparatus is manufactured that is adapted in a similar manner to the aforementioned embodiment by employing a white LED that emits light of a white color whose chromaticity deviates to the blue side from the desired white region (B region) in the band region 66 on the outside of the ranked white region as a first white LED, and likewise employing a white LED that emits light of a white color whose chromaticity deviates to the yellow side from the desired chromaticity region (B region) in the band region 66 on the outside of the ranked white region as a second white LED. Even if the emitted light color of the first white LED has a chromaticity in a white region that deviates further to the blue side than the A region, or even if the emitted light color of the second white LED has a chromaticity in a white region that deviates further to the yellow side than the C region, by means of PWM control of the current regulation section 33 it is possible to match the chromaticities of the emitted lights thereof in a similar manner as the white light emitting apparatus 20 to a chromaticity inside the B region.

Thus, when the chromaticity of light emitted by the first or second white LED is broadly selected with a wide region in the band region 66, a target chromaticity point of a color mixture of the lights emitted from the two white LEDs or a predetermined white region may not necessarily be limited to inside the B region, and the target point or predetermined white region may be a center part between chromaticity points of lights emitted by the two white LEDs, or the chromaticity point of the color mixture may move to a blue side or a yellow side with respect to the B region.

By enabling selection of chromaticities of a wide area outside of a ranked white region as emitted light colors of the first or second white LED in this manner, the usability of white LEDs is increased much more, and product costs can be decreased.

[Second Embodiment]

The Second Embodiment relates to PWM control of drive currents that effectively drives the two white LEDs used in the white light emitting apparatus of the First Embodiment to further increase the luminosity of the white light emitting apparatus that mixes the emitted light colors of the two white LEDs. The present embodiment also relates to a white light emitting apparatus that enables selection and use of white LEDs in which the chromaticities of emitted lights are distributed over a wide region by means of PWM control. The emitted light colors of the first and second white LEDs of the Second Embodiment are described using chromaticities inside the A region and C region, respectively, similarly to the First Embodiment.

First, current control that adjusts the chromaticity of a white light emitting apparatus that includes the two white LEDs is described in a case in which, on the CIE chromaticity diagram, there is a difference in the distance to the target point PD0 of the chromaticity after color mixing from the respective coordinate points of the chromaticities of the lights emitted by the two white LEDs 11 and 12 that are used. At this time, it is preferable to select LEDs so that the intensity of light emitted with a rated current by the first white LED 11 and the second white LED 12 is approximately the same. In order to make the light intensities uniform, the light intensity rank of the LEDs may be designated and such LEDs may be acquired from a manufacturer, or the LEDs may be individually driven and selected upon measuring the light intensities thereof.

For example, as illustrated in the CIE chromaticity diagram in FIG. 10, a chromaticity LA2 of an emitted light color from the first white LED 11 is positioned at point PA2 in A region, and a chromaticity of an emitted light color LC2 from the second white LED 12 is positioned at point PC2 in C region. A case will now be described in which the hue of the point PD0 positioned on a line segment connecting the two points PA2 and PC2 and at approximately the center of the B region is adjusted. For this purpose, it is sufficient to adjust the luminosity of each of the emitted light colors so that a weighted average for the coordinates of PA2 and PC2 obtained by weighting the luminosity of the emitted light colors LA2 and LC2 thereof becomes the coordinate values of PD0. In the present embodiment, since a distance ratio between the distance (PA2-PD0) and the distance (PC2-PD0) is 1:2 as illustrated in FIG. 10, the emitted light color of the color mixture from the white light emitting apparatus is made approximately the chromaticity of the point PD0 by adjusting the ratio of the luminosity between the emitted light colors LA2 and LC2 using the ratio 2:1 that is in inverse proportion to the distance ratio.

As illustrated in FIG. 10, the foregoing description describes a case in which the chromaticity PA2 of the first white LED, the target chromaticity point PD0 of the color mixture, and the chromaticity PC2 of the second white LED are on approximately the same straight line on the CIE chromaticity diagram. However, even if these points are not on the same straight line, by setting the luminosity of the emitted light colors LA2 and LC2 in inverse proportion to the distance ratio between the distance (PA2-PD0) and the distance (PC2-PD0), a color mixture of the emitted light colors of both LEDs becomes approximately a chromaticity of the predetermined white region (B region) that is a favorable chromaticity.

This method of adjusting the color mixture can be expressed in a different way. That is, the luminosity of a white LED that emits light whose chromaticity is closer to the target point PD0 of the chromaticity after mixing colors is made higher than the luminosity of the other white LED that emits light whose chromaticity is at a position that is farther away from the target point PD0. According to the white light emitting apparatus of the present embodiment for which LEDs that have approximately the same light intensity are selected as the two white LEDs, the current regulation section 33 is used to continuously supply a constant current (not a pulse current) from the current regulating circuit 21 illustrated in FIG. 2 as the drive current of the white LED 11 that is closer to the target point PD0. In this state, only the drive current of the other white LED 12 is supplied using PWM control, and the pulse width t2 thereof is decided so that a mixture of the colors of the two white LEDs matches a target chromaticity by a similar method to the First Embodiment (see FIG. 11).

With respect to current control other than the current control illustrated in FIG. 11, it was confirmed that although the color mixture is approximately the target chromaticity when the current regulation section 33 is used to set the duration T to 100 milliseconds, t1 (pulse width subjected to PWM control with the drive current of the white LED 11) to 90 milliseconds, and t2 to 45 milliseconds, the luminosity is higher in the case of the current control illustrated in FIG. 11. Naturally, it is also favorable to set t1 to be the same as the duration and continuously drive the white LED 11, and set t2 to be half of t1 and drive the white LED 12.

The method of setting the pulse width in the above PWM control will now be summarized. For both the first and second white LEDs, the chromaticity of light emitted by each LED is previously measured with a measurement sensor device and the respective distances to a target chromaticity point PD0 after mixing colors on the CIE chromaticity diagram is calculated. The drive current of the white LED for which the distance in question is shorter is supplied using a constant current. Further, when supplying a current using PWM control, the setting is made so that the duty ratio of a pulse width P thereof is the maximum. On the other hand, it is favorable to set a pulse width p for driving the white LED for which the distance in question is longer to a value that is inversely proportional to the distance ratio with respect to the pulse width P. Naturally, a configuration may also be adopted as in the First Embodiment in which the pulse width that drives the white LED for which the distance to the target chromaticity point is longer is adjusted while monitoring the color mixture with a measurement sensor device.

According to the present embodiment, a ratio (t1/t2) between the pulse width t1 of the white LED 11 that is nearer to the point PD0 and the pulse width t2 of the white LED 12 that is farther from the point PD0 can be set to be larger because t1 is a maximum value. This enables the distance (PC2-PD0) to be made longer with respect to the distance (PA2-PD0), and makes it possible to utilize a white LED that emits light whose chromaticity is further from the target point PD0 of the color mixture. This enhances the usability of white LEDs that emit light whose chromaticity deviates from the predetermined white region (B region), and can lower the total cost when acquiring white LEDs.

[Third Embodiment]

The Third Embodiment relates to a line illuminator 50 that uses the white light emitting apparatus 20 of the First Embodiment. The line illuminator 50 is described in detail below with reference to FIGS. 12 to 15.

The line illuminator 50 of the present embodiment is used to illuminate an original copy surface such as a paper surface in an image reading apparatus, for example. The line illuminator 50 is, as illustrated in FIG. 12, provided with a bar-shaped light guide member 51 that is formed of a clear material and has a light incident surface 54 at one end thereof, and a light source section 10 disposed toward the light incident surface 54. The light source section 10 is connected with the current regulation section 33 via a terminal lead wire 62 as in the case of the First Embodiment (not illustrated in FIG. 12). The light guide member 51 is provided with a light guiding section 52 for guiding an incident light from the light incident surface 54 in the longitudinal direction while causing the light to be reflected by the inner surface of the light guide member 51, and a light emitting section 53 having a light emitting surface for causing light from the light guiding section 52 to be emitted linearly in the longitudinal direction.

In order that the light from the light source section 10 can be incident from the light incident surface 54 of the light guide member 51 without wasting the light, as illustrated in FIG. 13, the external dimensions of a radiating surface 63 that radiates light of the light source section 10 are designed so that the radiating surface 63 can be included inside the external shape of the light incident surface 54 of the light guide member 51 with a sufficient margin. For example, on the side of a surface that radiates light of the light source section 10, as illustrated in FIG. 13, two white LED are arranged that each have a size of 1.2 mm×2 mm, and the external dimensions of the side of the surface that radiates light of the light source section 10 are 2.5 mm (horizontal direction)×2 mm (vertical direction). Further, the external size of the light incident surface 54 of the light guide member 51 illustrated in FIG. 12 is 3.5 mm (W direction)×2.5 mm (H direction). Furthermore, the design is one in which, by disposing the radiating surface 63 of the light source section 10 as near as possible to the light incident surface 54 of the light guide member 51, light from the white light emitting apparatus 20 is made incident on the light guide member 51 without waste.

The light guide member 51 may be, for example, a light guide member that is compatible with use for a three-primary color light source that has LEDs of three wavelengths (for example, for red, green, and blue) arranged thereon (at different positions). That means a light guide member designed for linear illumination may be used in which lights from a plurality of light sources that have different wavelengths are incident from a light incident surface, and proper reflection and scattering occur in the light guide member for each wavelength, so that a light is emitted with the outputs of the wavelengths being uniformly distributed in the longitudinal direction thereof. A light guide member having such a function is described in detail in, for example, Patent Document 1.

Therefore, even when there is a difference in the hues of emitted light colors between the two white LEDs 11 and 12 of the light source section 10 in the white light emitting apparatus 20 which are used as light sources, and also the central points of the two emitted lights are not at the same position, and furthermore even when a distance to the light incident surface 54 from the white light emitting apparatus 20 is short and sufficient color mixing cannot be obtained in this space, the light guide member 51 allows the colors of the incident lights from the light incident surface 54 to be well mixed so as to emit a linear illumination light that has a uniform color distribution of whiteness.

The inventors of the present invention checked the above described effect of the line illuminator 50 of the present embodiment in the following procedure. First, as illustrated in FIG. 14, the line illuminator 50 was incorporated in a contact-type image sensor unit (hereinafter, simply referred to as CIS unit) 60 that constitutes an image reading apparatus. Although not illustrated in FIG. 14, the current regulation section 33 of the white light emitting apparatus 20 was connected via a connector 61.

The CIS unit 60 was used to cause a light reflected by an original paper copy 59 to be focused on a line sensor 56 by a lens array 55. The line sensor 56 that was used was configured with three linear rows of pixels that separately receive a color of red (R), green (G), or blue (B) for photoelectric conversion (illustration is omitted). The line sensor 56 has three color filters that have pass bands for RGB and are disposed on each row of pixels. Therefore, each row of pixels functions with spectral sensitivity corresponding to each of the R, B, and G colors. Such a sensor array is described, for example, in Patent Document 3.

Therefore, the CIS unit 60 is able to separate the white light reflected by the original paper copy 59 into each of the R, G, and B colors, and measure the illuminance for each pixel of the row of pixels arranged in the longitudinal direction thereof. The measured illuminance value for each pixel can be represented as the illuminance distribution for the area from one end surface on the light incident surface side to the other end surface in the longitudinal direction of the light guide member 51.

Figure 15:
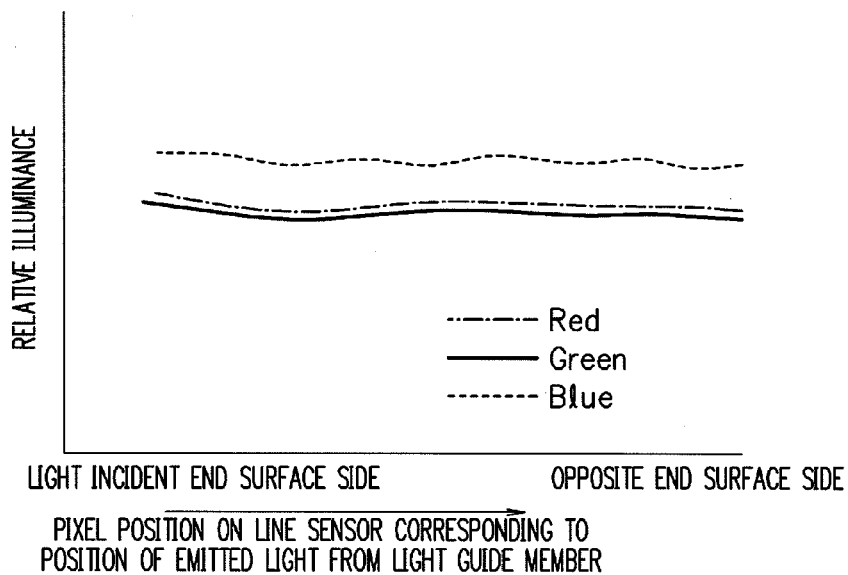
FIG. 15 is a view for describing an illuminance distribution in a longitudinal direction when an illumination light of a line illuminator of the Third Embodiment according to the present invention is divided into red (R), green (G), and blue (B)

Next, similarly to the First Embodiment, after the original paper copy 59 was replaced with a predetermined white paper for reference, both of the white LEDs 11 and 12 were driven with the current regulation section 33. Further, the illumination light of the line illuminator 50 was measured for the relative illuminance of each of the R, G, and B colors as the illuminance distribution in the linear direction. In the measurement, the currents applied to both of the white LEDs 11 and 12 were set to 10 mA, respectively. The measured result for illuminance distributions showed generally uniform distributions in the longitudinal direction with approximately the same values of relative illuminance for the red and green colors as illustrated in FIG. 15. Further, for the blue color, the result showed a substantially uniform distribution in the longitudinal direction, with a higher relative illuminance compared to those of the red and green colors.

The emitted light color of the white light emitting apparatus 20 that uses the line illuminator 50 of the Third Embodiment is a light source that has been adjusted so as to have a chromaticity in B region in FIG. 7A according to the First Embodiment, and for which the relative illuminance of blue is somewhat larger. However, differences between the sizes of the relative illuminance of red, green, and blue can be adjusted with a data processing section in the image reading apparatus that controls the CIS unit. The advantage of a line illuminator that captures emitted light from the white light emitting apparatus 20 of the First Embodiment in the light guide member 51 and linearly illuminates a paper surface is that emitted light colors with different hues from two white LEDs are adequately mixed in the light guide member 51. A drawback of a white LED that includes a blue LED chip and a YAG phosphor is that there is an inconsistency between the color at the center of the light beam and the color at the periphery thereof, such as a strong yellow color at the periphery of a beam of emitted light. FIG. 15 illustrates output obtained when the respective emitted light colors from the first and second white LEDs are sufficiently scattered and mixed inside the light guide member 51 and then used to illuminate an original copy surface with a linear light beam, and the reflected light thereof is received with the line sensor 56 via the lens array 55 and subjected to photoelectric conversion. As illustrated in FIG. 15, although there is a difference between the relative illuminance of each of the R, G, and B colors (the relative illuminance of blue is large), it was confirmed that reflected light from the original copy undergoes color mixing without any inconsistency for all of the colors in the main scanning direction (opposite surface side from light incident surface side) of the CIS unit and the relative illuminance is approximately constant and homogeneous. Accordingly, the line illuminator of the present embodiment is an invention that effectively makes use of the characteristics of the white light emitting apparatus 20 of the First Embodiment. Further, a line illuminator that achieves similar advantages can be obtained using the white light emitting apparatus of the Second Embodiment.

[Fourth Embodiment]

A white light emitting apparatus according to a fourth embodiment is provided with two or more white light emitting diodes. Each of the white light emitting diodes includes a blue LED chip, and a fluorescent layer which is excited by a radiation light emitted by the blue LED chip and emits a yellow light. Yellow is a complementary color of blue. In the fourth embodiment, a white light emitting apparatus 120 having the two or more white light emitting diodes will be explained below with reference to FIGS. 17 to 21.

Figure 16:
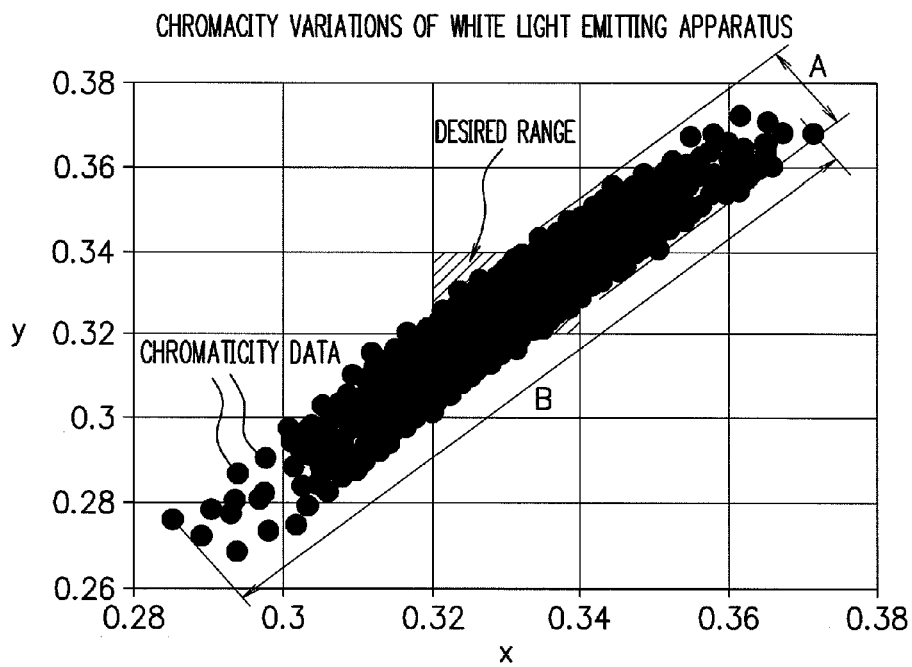
FIG. 16 is a distribution chart that illustrates variations in the chromaticity of white LEDs.
Figure 17:
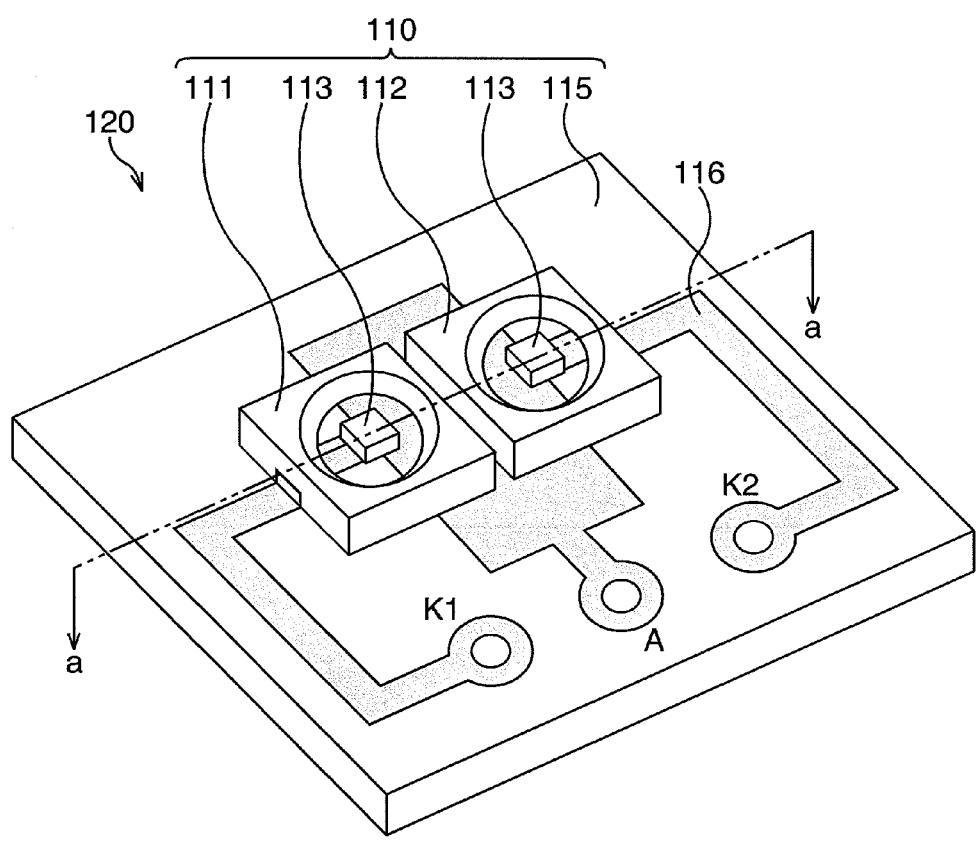
FIG. 17 is a perspective diagram illustrating a light source section of a white light emitting apparatus according to a fourth embodiment of the present invention.

FIG. 16 illustrates a light source section 110 of the white light emitting apparatus 120 of the fourth embodiment. In the white light emitting apparatus 120, a first white light emitting diode 111 and a second white light emitting diode 112 are adjacently mounted to a printed circuit board 115. The first white light emitting diode 111 emits a white light which is more yellowish and deviated from the white point on a chromaticity diagram. The second white light emitting diode 112 emits a white light which is more bluish and deviated from the white point on a chromaticity diagram. The white light emitting diodes 111 and 112 are also arranged to emit light in parallel to each other and in the same direction substantially. The printed circuit board 115 is provided with wiring 116 for electric supply, including an anode line which is common to the two white light emitting diodes 111 and 112, and two cathode lines connected to each of the white light emitting diodes 111 and 112. The anode line and the two cathode lines are connected to an external current control section (see FIG. 18) through terminals A, K1, and K2 respectively. The current control section causes the white light emitting diodes 111 and 112, which constitute the light source section 110 of the white light emitting apparatus 120, to be driven.

The first white light emitting diode 111 may be, for example, a white light emitting diode that is recognized to emit a yellowish white light in accordance with a recognition method by lighting a constant current of 10 mA among the white light emitting diodes of white LEDs each of which is a commercially available surface mount LED package having a longitudinal dimension of about 2.0 mm and a lateral dimension of about 1.2 mm (NESW007A, manufactured by Nichia Corporation). The second white light emitting diode 112 may be, for example, a white light emitting diode that is recognized to emit a bluish white light in accordance with a recognition method by lighting a constant current of 10 mA among the white light emitting diodes of white LEDs each of which is a commercially available surface mount LED package having a longitudinal dimension of about 2.0 mm and a lateral dimension of about 1.2 mm (NESW007A, manufactured by Nichia Corporation).

Figure 19:
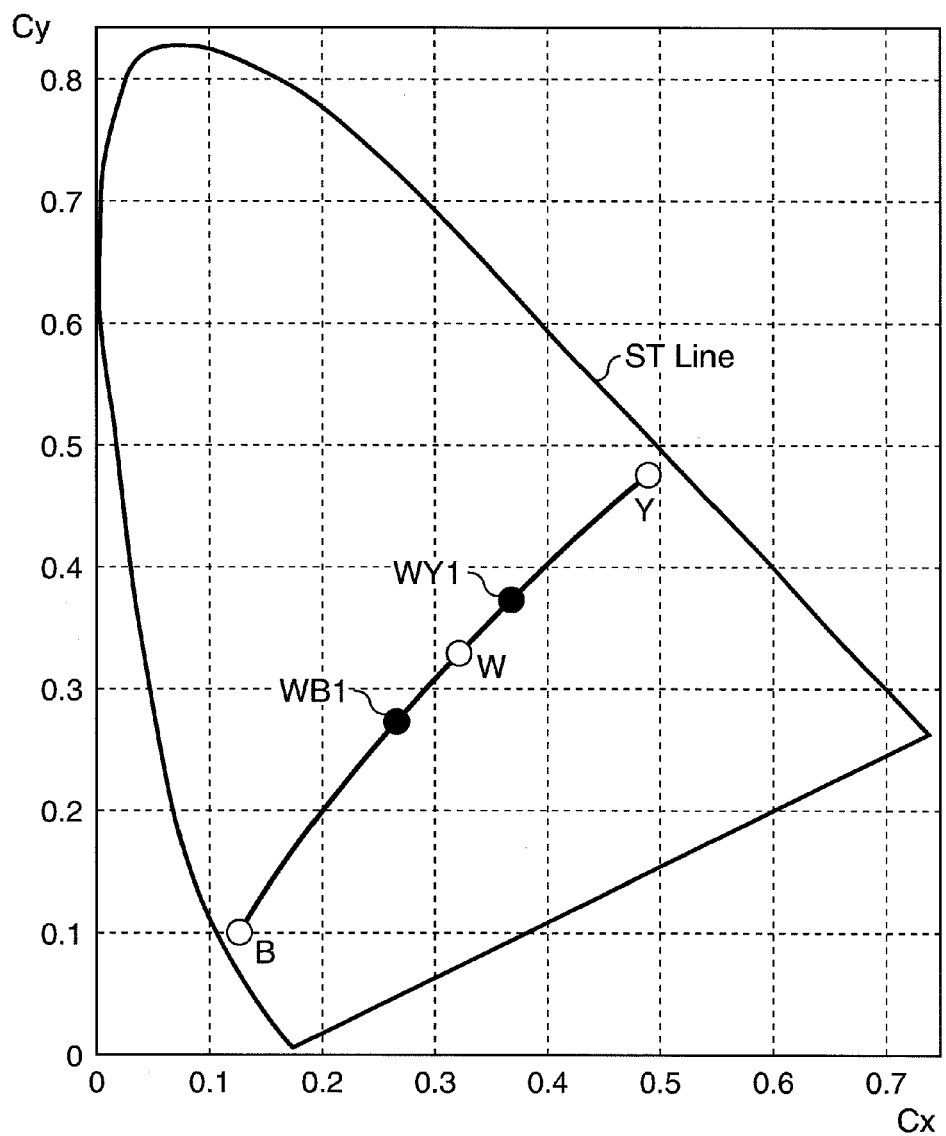
FIG. 19 is a chromaticity diagram illustrating a relationship between chromaticities of emitted lights from the white light emitting apparatus according to the fourth embodiment of the present invention.

Now, the relationship between chromaticity of the lights emitted by each of the white light emitting diodes 111 and 112 of the fourth embodiment will be explained below using the chromaticity diagrams of FIG. 19 and FIG. 30. For the first white light emitting diode 111, a white light emitting diode is selected so that a blue light, which is emitted from a blue LED chip therein and does not interact with fluorescent particles in a fluorescent layer, and a yellow light, which is generated by wavelength conversion after the interaction with the fluorescent particles, produce a color mixture that has its color distribution on the yellow side of the white point. For the second white light emitting diode 112, similarly, a white light emitting diode is selected so that a blue light and a yellow light produce a color mixture that has its color distribution on the blue side of the white point.

The above relationship will be explained below using the chromaticity diagram illustrated in FIG. 19. In the chromaticity diagram, the chromaticity point of a yellow light (560 nm) after wavelength conversion by a YAG fluorescent substance is shown by Y, and the chromaticity point of a blue light emitted from a blue LED chip (one representative from the range of 450 nm to 470 nm) is shown by B. When a curved line YB is defined on the assumption that both of the chromaticity points Y and B are positioned near a curved line ST, which illustrates a monochromatic light in the chromaticity diagram, the curved line YB passes near the white color chromaticity point W (x=0.33, y=0.33). This is because the YAG fluorescent substance is used to obtain a fluorescent white light by compositing a light emitted from a blue LED chip and a light emitted by the fluorescent substance.

The chromaticity point WY1 of the color mixture of the light emitted from the first white light emitting diode 111 is substantially positioned on the curved line WY, which is connected between the white point W and the yellow point Y. The chromaticity point WB1 of the color mixture of the light emitted from the second white light emitting diode 112 is substantially positioned on the curved line WB, which is connected between the white point W and the blue point B.

Figure 30:
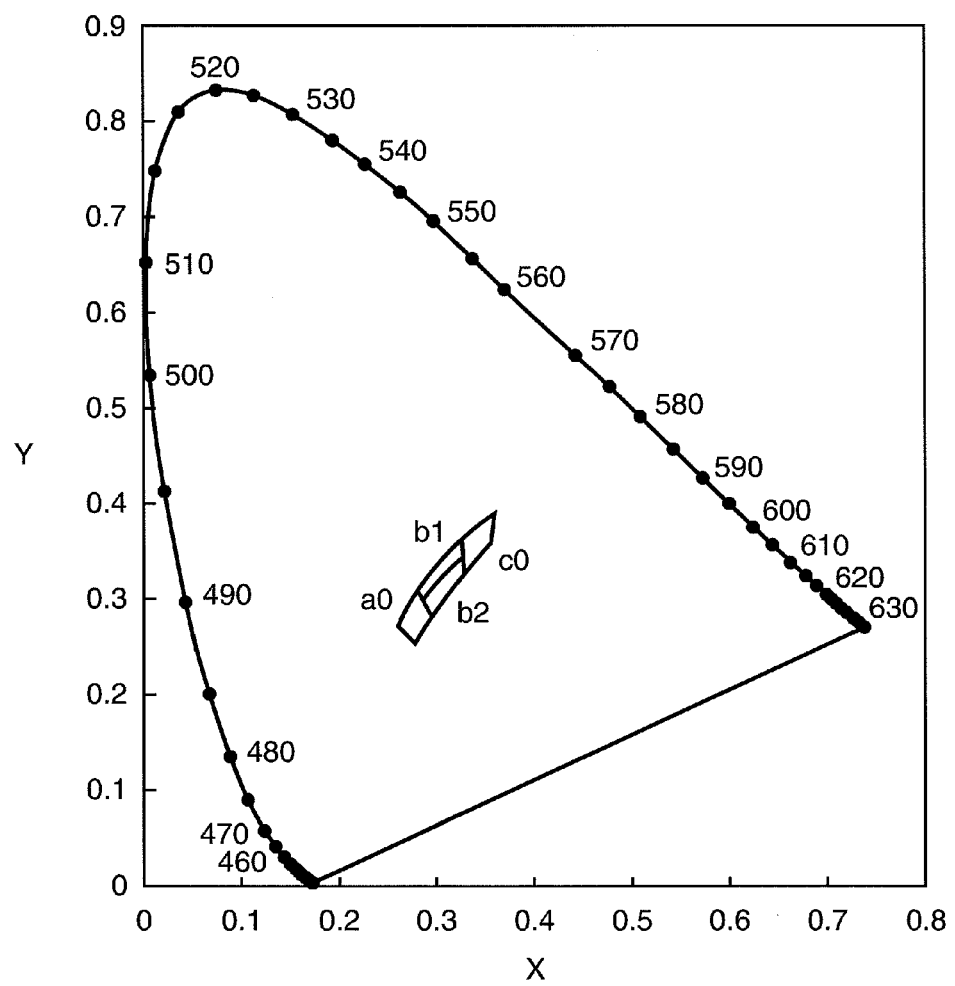
FIG. 30 is a chromaticity diagram illustrating a relationship between the degrees of whiteness of a white light emitting diode and identification areas.

Meanwhile, one example of chromaticity areas that can be selected with luminescence thereof in a selection using a constant current of 10 mA by a selector is illustrated in FIG. 30. Therefore, as the first white light emitting diode 111, a light emitting diode that has a chromaticity coordinate: $0.33 < Cx \leq 0.36$; $0.33 < Cy \leq 0.38$ when driven at a constant current of 10 mA is preferably used, with the chromaticity coordinate being substantially on the curved line YB. Also, as the second white light emitting diode 112, a light emitting diode that generally has a chromaticity coordinate: $0.27 \leq Cx < 0.33$; $0.26 \leq Cy < 0.33$ when driven at a constant current of 10 mA is preferably used, with the chromaticity coordinate being substantially on the curved line YB. As described above, in the present invention, the yellowish white means white color the position of which is substantially close to the white point on the curved line WY, while the bluish white means white color the position of which is substantially close to the white point on the curved line WB.

Figure 18:
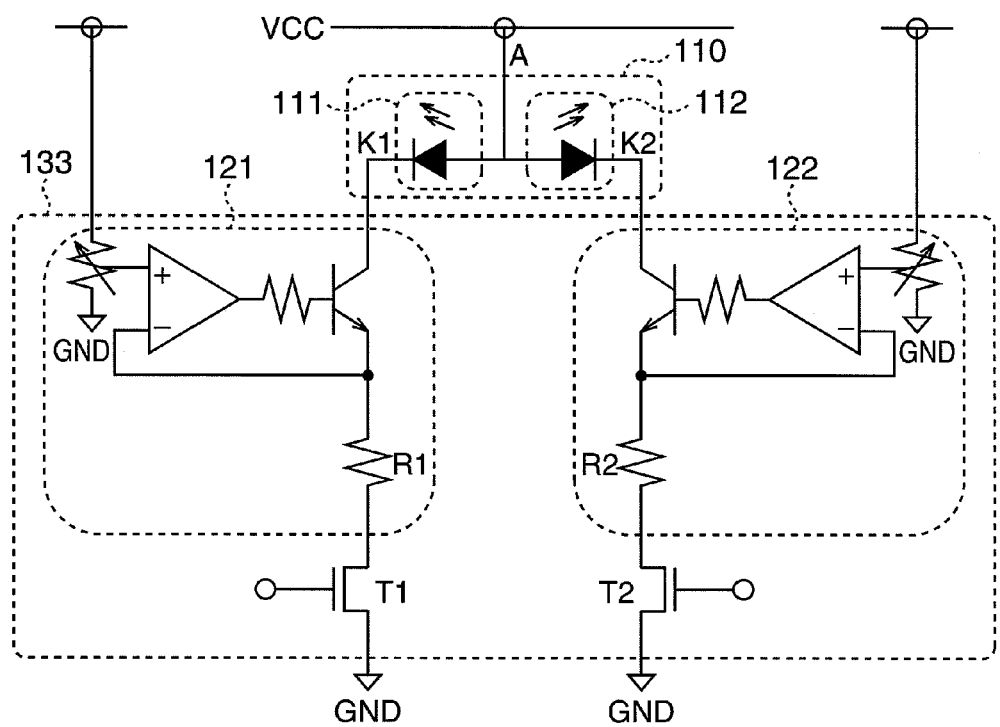
FIG. 18 is a diagram illustrating one example of an electrical circuit driving the white light emitting apparatus according to the fourth embodiment of the present invention.

FIG. 18 is a diagram illustrating one example of an electrical circuit driving the white light emitting apparatus 120. The electrical circuit includes the light source section 110 and a current control section 133. The light source section 110 corresponds to the part illustrated in FIG. 17. The current control section 133 includes current control sections that are separately provided to set a current for each of the white light emitting diodes 111 and 112. For example, current regulating circuits 121 and 122 are connected in parallel to each of the white light emitting diodes 111 and 112 via two cathode terminals K1 and K2 of the light source section 110, respectively. Also, transistors T1 and T2 turning ON/OFF each of the white light emitting diodes 111 and 112 are connected to the current regulating circuits 121 and 122, respectively. The transistors T1 and T2 are connected to ground GND.

Each of the current regulating circuits 121 and 122 are, for example, provided with an operation amplifier, a transistor, and current-limiting resistor R1 or R2. The current control section 133 causes a constant current that is defined for each of the white light emitting diodes 111 and 112 to be applied to each of the white light emitting diodes 111 and 112, so as to control the lighting of each of the white light emitting diodes 111 and 112 by a pulse width modulation (hereinafter, simply referred to as PWM) method. Such current control section 133 functions as a current control means.

Figure 20:
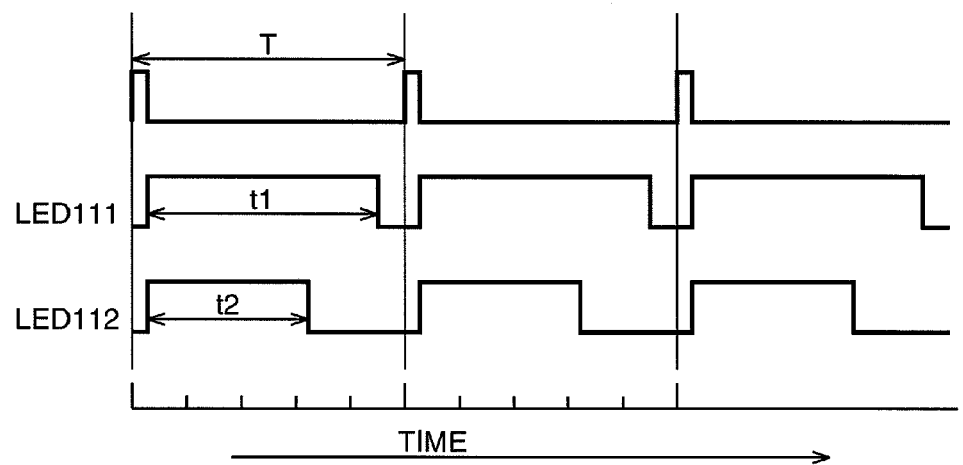
FIG. 20 is a diagram illustrating a control of illumination duration of a white light emitting diode in the fourth embodiment of the present invention.

Next, the current control operation for obtaining a color mixture of emitted lights from the white light emitting apparatus 120 of the fourth embodiment that is substantially adjusted to the white point on a chromaticity diagram will be explained below. FIG. 20 is a timing chart illustrating a control of the illumination durations of the white light emitting diodes 111 and 112 by a pulse width modulation (PWM) method.

First, the white light emitting apparatus 120 is operated with a duration of pulse T being set to be 10 milliseconds, a current driving the white light emitting diodes 111 and 112 being set to be 10 mA, an illumination duration t1 of the white light emitting diode 111 being set to be 9 milliseconds for each cycle. The drive currents of the white light emitting diodes 111 and 112 are set by the current regulating circuits 121 and 122 respectively, and the illumination duration t1 is controlled by the transistor T1.

Next, a sensor measuring chromaticity is installed at a position, above the light emitting surface of the white light emitting apparatus 120, which is separated from the two white light emitting diodes 111 and 112 by a distance so that the emitted lights are sufficiently mixed with each other, and a measurement of chromaticity is started, with a time for receiving time being set to be several tens times that of the duration T.

Then, an illumination duration t2 of the white light emitting diode 112 for each cycle is controlled by the transistor T2, to find an illumination duration t2 for a chromaticity measurement by a light emitted from the white light emitting apparatus 120: Cx=0.33, and Cy=0.33, approximately.

Here, in order to allow a color mixture of emitted lights from the white light emitting apparatus 120 to substantially reach the white point on a chromaticity diagram, the PWM control by the current control section 133 may be used to cause the white light emitting diode 111 to light in accordance with a duty ratio D1=t1/T, and the white light emitting diode 112 to light in accordance with a duty ratio D2=t2/T.

As described above, according to the fourth embodiment, an emission of a light having a high purity of whiteness, which was difficult by one white light emitting diode, is achieved, and the high power white light emitting apparatus 120 is attained. Also, depending on the control of a drive current of each of the white light emitting diodes 111 and 112, the chromaticity coordinate of a light emission from the white light emitting apparatus 120 can be changed from the chromaticity point WY1 to the chromaticity point WB1 along the curved line YB.

As the current control in the white light emitting apparatus 120, instead of the control with the PWM method, the amounts of currents driving the white light emitting diodes 111 and 112 may be controlled. The amounts of currents can be controlled by the current regulating circuits 121 and 122. Alternatively, the control with the PWM method and the control of the current amounts may be combined.

Figure 21:
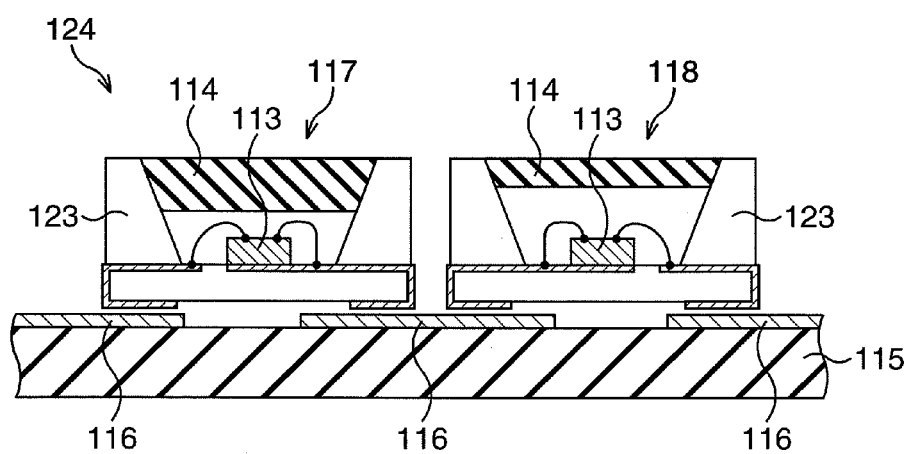
FIG. 21 is a cross sectional diagram illustrating a modified embodiment of the white light emitting apparatus according to the fourth embodiment of the present invention.

Next, a modified embodiment of the fourth embodiment will be explained below with reference to FIG. 21. A white light emitting apparatus 124 according to the modified embodiment includes two types of white light emitting diodes 117 and 118 adjacently mounted on the printed circuit board 115, the diodes 117 and 118 being individually provided with a fluorescent layer 114 of a different thickness from each other. That means the first white light emitting diode 117 is provided with a thicker fluorescent layer 114, and the color mixture of the lights emitted from the white light emitting diode 117 is yellowish white, similar to the white light emitting diode 111. The second white light emitting diode 118 is provided with a thinner fluorescent layer 114, and the color mixture of the lights emitted from the white light emitting diode 118 is bluish white, similar to the white light emitting diode 112. The thickness of the fluorescent layer 114 is controlled during the manufacture of the white light emitting diodes 117 and 118, for example.

The white light emitting apparatus 124 in which the current control section 133 is connected to the light source section 110 including the above described white light emitting diodes 117 and 118 therein can also provide high purity whiteness as in the case of the fourth embodiment. In addition, as compared with the white light emitting diode with one blue LED chip, a higher power emission of white light can be obtained.

[Fifth Embodiment]

A linear illuminator 150 according to a fifth embodiment uses the white light emitting apparatus 120 according to the fourth embodiment. The linear illuminator 150 will be explained in detail below with reference to FIGS. 22 to 24.

Figure 22:
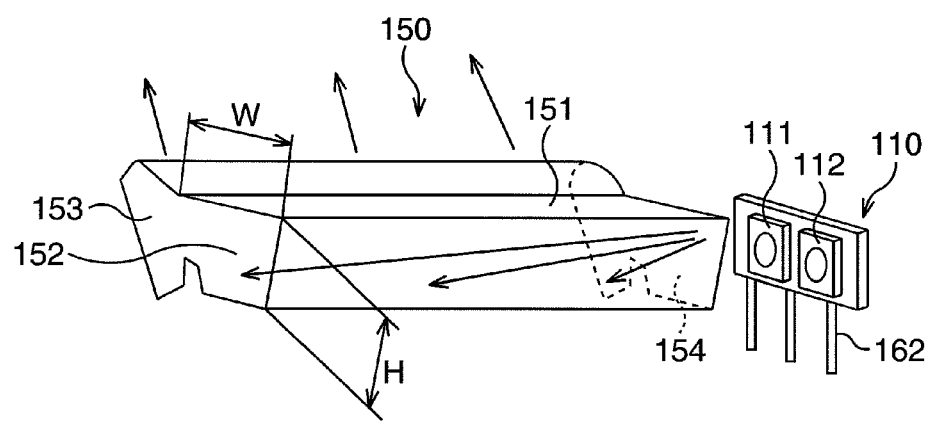
FIG. 22 is a perspective diagram illustrating a linear illuminator according to a fifth embodiment of the present invention.

The linear illuminator 150 of the fifth embodiment is used to illuminate a surface of a manuscript such as a paper in an image reading apparatus, for example. The linear illuminator 150 is, as illustrated in FIG. 22, provided with a bar-shaped light guide member 151 that is formed of a transparent material and has a light incident surface 154 at one end thereof, and the light source section 110 disposed toward the light incident surface 154. The light source section 110 is connected with the current control section 133 via terminal lead 162 as in the case of the fourth embodiment (not illustrated in FIG. 22). The light guide member 151 is provided with a light guiding section 152 guiding an incident light from the light incident surface 154 in the longitudinal direction of the light guide member, and a light emitting section 153 linearly emitting the light from the light guiding section 152 in the longitudinal direction.

In order to improve the light yield of the light guide member 151 from the light incident surface 154 into the light guide member 151, the light source section 110 is designed to have a light emitting surface of a size that can be included in the light incident surface 154 with margin. For example, in the case with the light emitting surface of the light source section 110 having a size of 2.5 mm (horizontal direction)×2 mm (vertical direction), the light guide member 151 is designed to have a light emitting surface having a size of 3.5 mm (horizontal direction)×2.5 mm (vertical direction)

The light guide member 151 may be, for example, a member for a light source that has light emitting diodes of three wavelengths (for example, for red, green, and blue) arranged thereon (at different positions). That means a light guide member designed for linear illumination may be used, in which lights from a light source are incident to a light incident surface, and proper reflection and scattering occur in the light guide member for each wavelength, so that a light is emitted with the outputs of the wavelengths being uniformly distributed in the longitudinal direction thereof. A light guide member having such a function is described in detail in Japanese Laid-Open Patent Publication No. 2006-287923, for example.

Therefore, even when there is a difference in the wavelengths of emitted lights from the two white light emitting diodes 111 and 112 of the light source section 110 in the white light emitting apparatus 120, which are used as light sources, and also the central points of the two emitted lights are not at the same position, the light guide member 151 allows the colors of the incident lights from the light incident surface 154 to be well mixed so as to emit a linear illumination light that has a uniform color distribution of whiteness.

Figure 23:
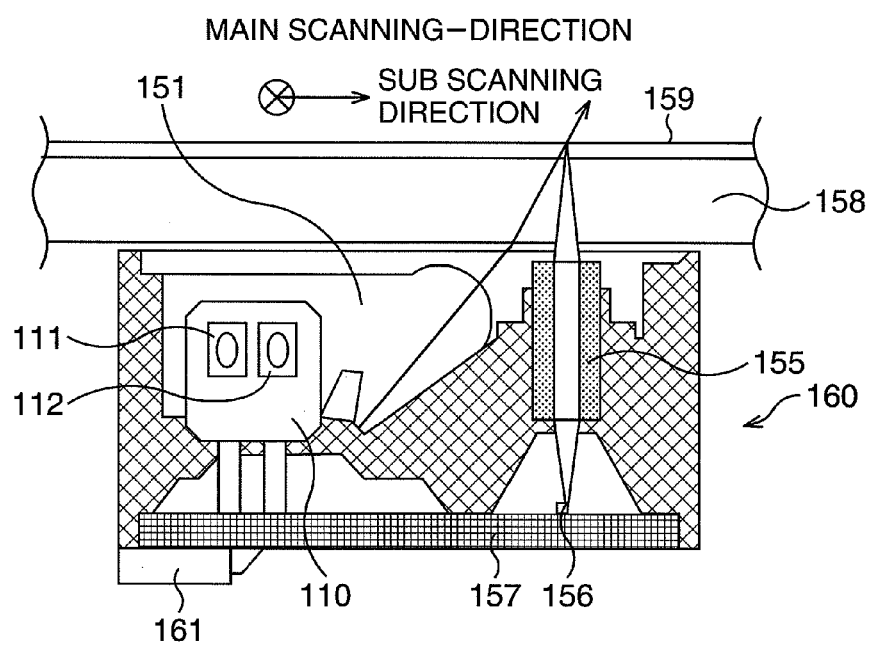
FIG. 23 is a cross sectional diagram illustrating a contact-type image sensor unit in which the linear illuminator according to the fifth embodiment of the present invention is incorporated.

The inventors of the present invention checked the above described effect of the linear illuminator 150 of the fifth embodiment in the following procedure. First, as illustrated in FIG. 23, the linear illuminator 150 was incorporated in a contact image sensor unit (hereinafter, simply referred to as CIS unit) 160 that constitutes an image reading apparatus. Not illustrated, but the current control section 133 of the white light emitting apparatus 120 was connected via the connector 161.

The CIS unit 160 was used to cause a light reflected by the paper manuscript 159 to be focused on a line sensor 156 by a lens array 155. The line sensor 156 was the one configured with three linear rows of pixels that separately receive a color of red (R), green (G), or blue (B) for photoelectric conversion (illustration is omitted). The line sensor 156 has three color filters that have pass bands for RGB and are disposed on each row of pixels. Therefore, each row of pixels functions with spectral sensitivity corresponding to each of the R, B, and G colors. Such sensor array is described in Japanese Patent No. 3990437, for example.

Therefore, the CIS unit 160 is able to separate the white light reflected by the paper manuscript 159 into each of the R, B, and G colors, and measure the illuminance for each pixel of the row of pixels arranged in the longitudinal direction thereof. The measured illuminance value for each pixel can be represented as illuminance distribution for the area from one end surface on the light incident surface side to the other end surface in the longitudinal direction of the light guide member 151.

Figure 24A:
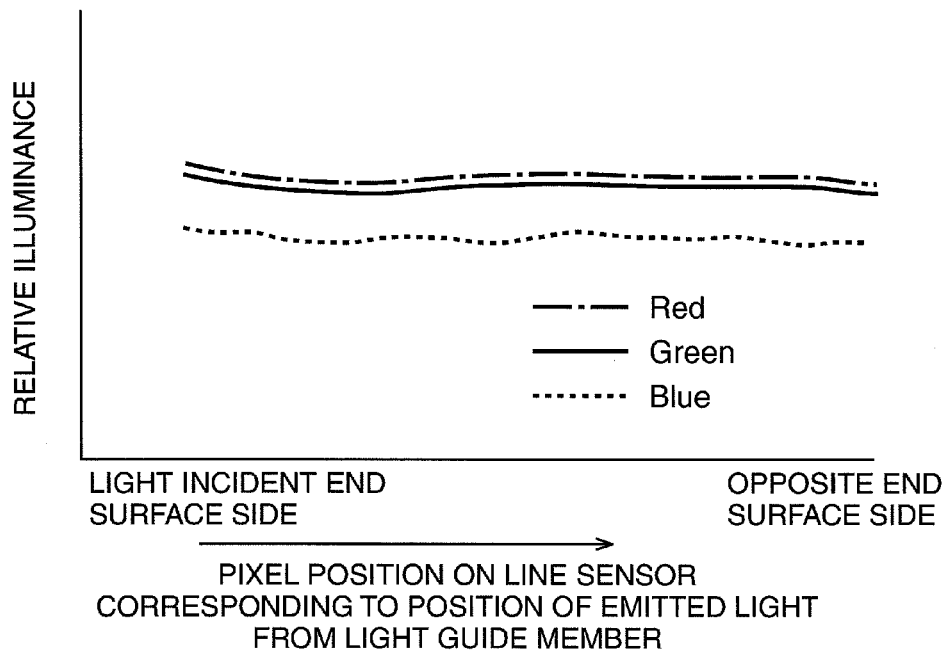
FIG. 24A is a diagram illustrating the relative illuminance between each of R, G, and B colors before an adjustment of illumination duration in the linear illuminator according to the fifth embodiment of the present invention.
Figure 24B:
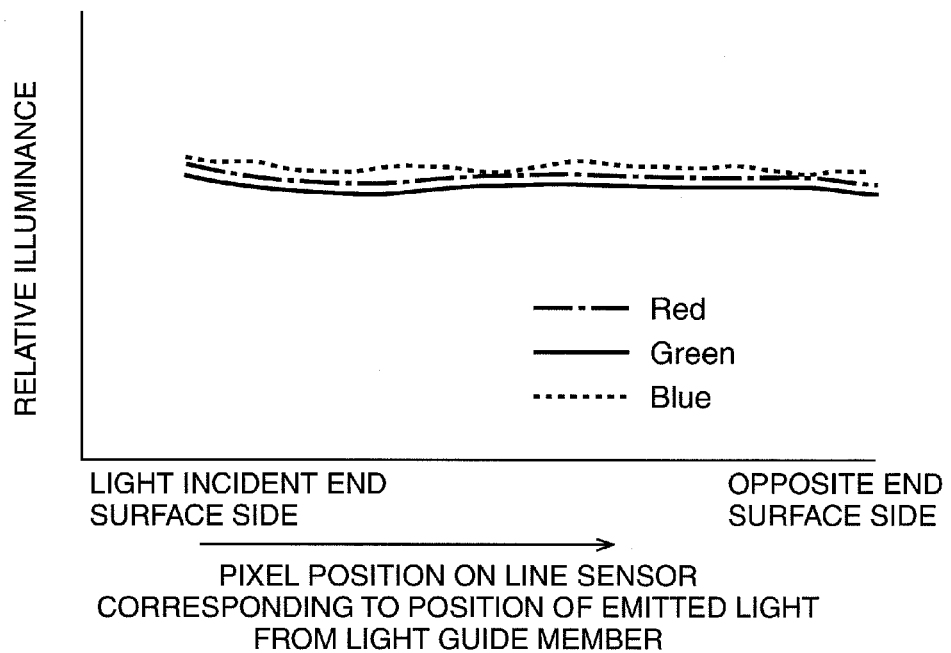
FIG. 24B is a diagram illustrating the relative illuminance between each of R, G, and B colors after the adjustment of illumination duration in the linear illuminator according to the fifth embodiment of the present invention.

Next, as in the case of the fourth embodiment, after the paper manuscript 159 was replaced with a predetermined white paper for reference, both of the white light emitting diodes 111 and 112 were simultaneously driven with the current control section 133. And the illumination light of the linear illuminator 150 was measured for the relative illuminance of each of R, G, and B colors as illuminance distribution in the linear direction (FIG. 24A). In the measurement, the currents applied to both of the white light emitting diodes 111 and 112 were controlled to be 10 mA. The measured result for illuminance distributions showed generally uniform distributions in the longitudinal direction with approximately the same values of relative illuminance for red and green colors as illustrated in FIG. 24A, but for blue color, the result showed a substantially uniform distribution in the longitudinal direction with a lower relative illuminance as compared to those of red and green colors.

Then, as in the case of the fourth embodiment, after the illumination duration for each cycle of the white light emitting diode 112, that is the duty ratio D2, was controlled, the relative illuminance of each of R, G, and B colors could be controlled to have substantially the same distribution, as illustrated in FIG. 8B.

The above result of the fifth embodiment showed that the linear illuminator 150 for illumination with the relative illuminance of each of R, G, and B colors being well balanced can be manufactured.

In a conventional linear illuminator that uses one white light emitting diode as a light source, often a white light emitting diode for pure whiteness is selected with efforts by sacrificing cost, or a white light emitting diode having deviation in color distribution of whiteness is selected to obtain a white illumination light of a low quality as a result. To the contrary, according to the linear illuminator 150 of the fifth embodiment, it was found that when commercially available white light emitting diodes having deviation in color distribution of whiteness are combined and the illumination duration is controlled by controlling a duty ratio by the PWM method, for example, a highly pure white illumination light can be readily obtained.

The combination of the white light emitting diodes 111 and 112 may be accomplished by selecting a diode emitting a yellowish white light and a diode emitting a bluish white light, and the chromaticity value of each diode which is inherent property of a white light emitting diode may not be determined at the point of time of selection. Therefore, the white light emitting diodes 111 and 112 may be any diode that emits a light that has a position generally on the curved line YB in the chromaticity diagram of FIG. 19, even if the position is deviated from the white point to a large degree. As a result, white light emitting diodes that have been determined to be defective become usable without discarding, which leads to enhanced productivity of white light emitting diodes.

[Sixth Embodiment]

Figure 25B:
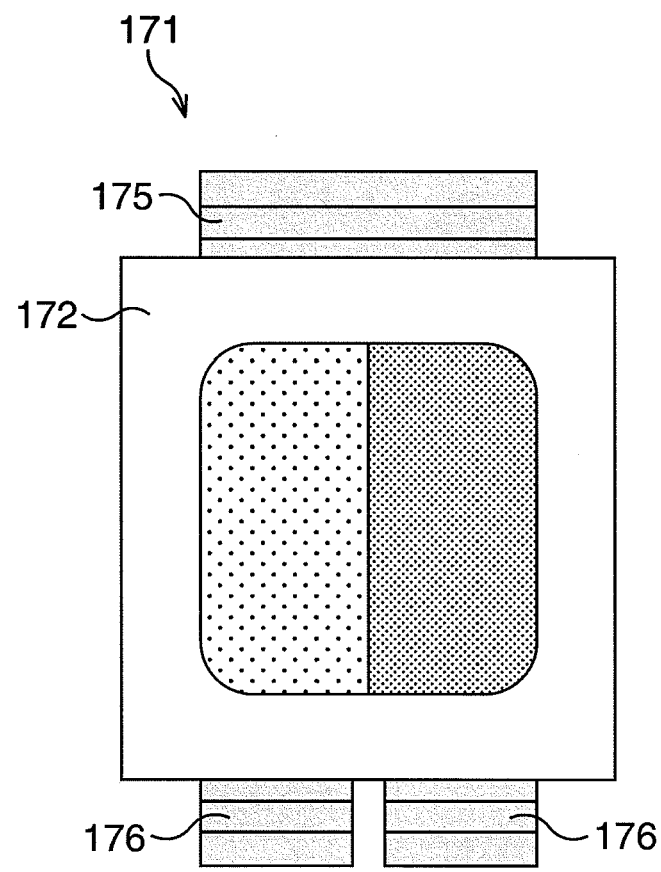
FIG. 25B is a diagram illustrating the method subsequent to FIG. 25A for manufacturing a white light emitting diode according to the sixth embodiment of the present invention (a configuration after a fluorescent layer is formed)
Figure 25B:
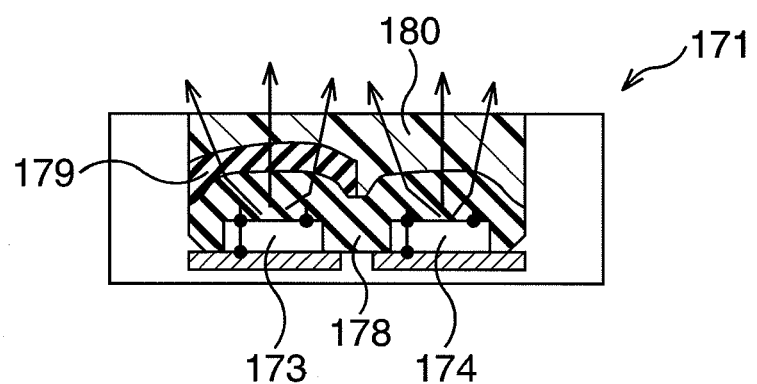

In a sixth embodiment, two blue LED chips are mounted to one package, and a YAG fluorescent layer covers each of the blue LED chips and has a thickness different from those of others. With reference to FIGS. 25A and 25B, a method for manufacturing a white light emitting diode 171 of the sixth embodiment will be explained below.

A package 172 is formed of a resin into a box shape with the top thereof being open, and the package 172 has wiring of a lead frame at the bottom thereof, so that an anode wiring 175 of a lead frame at the bottom has a first blue LED chip 173 and a second blue LED chip 174 disposed thereon. Then, the cathode terminal and the anode terminal thereof are connected to the cathode wiring 176 and the anode wiring 175 of the lead frame respectively by using a wire-bonding method for example, to be mounted (FIG. 25A). The top opening may have a dimension of about 2.5 mm or less in the longitudinal and lateral directions thereof, for example.

Next, a resin solution for fluorescent layer is prepared by mixing a predetermined amount of YAG fluorescent particles into a clear thermosetting transparent resin, which is coated to both of the blue LED chips 173 and 174 for covering. Then, the resin solution for fluorescent layer is subjected to a heat cure procedure, so that a first fluorescent layer 178 is formed as illustrated in FIG. 25B. Then, a resin solution for fluorescent layer which is the same as the above resin solution for fluorescent layer is coated to the surface of the fluorescent layer 178 to cover only the upper side of the blue LED chip 173. Then, the resin solution for fluorescent layer is subjected to a heat cure procedure, so that a second fluorescent layer 179 is formed. Then, a seal body 180 is formed on the fluorescent layers 178 and 179 using the same thermosetting transparent resin as that included in the resin solution for fluorescent layer. In this way, as illustrated in FIG. 25B, the white light emitting diode 171 is made.

The thicknesses of the fluorescent layers 178 and 179 may be determined in advance as follows, for example. First, a plurality of blue LED chips that are the same products as the blue LED chips 173 and 174 are provided, and fluorescent layers having different thicknesses from each other are formed using the resin solution for fluorescent layer that is prepared as described above. As a result, a plurality of white light emitting diodes for evaluation can be obtained. Next, the white light emitting diodes for evaluation are caused to emit a light at a predetermined current, so that the diodes that produce a color mixture of bluish white without fail with the blue light, which does not interact with the fluorescent particles, and the yellow light, which interacts with the fluorescent particles in the fluorescent layer for wavelength conversion, and a range of the thickness of the fluorescent layer 178 is determined based on the thicknesses of the fluorescent layers. Next, a plurality of white light emitting diode that has the fluorescent layer 178 having a thickness within the range formed on each blue LED chip are provided, and a fluorescent layer is formed on each diode with the resin solution for fluorescent layer that is prepared as described above. As a result, a plurality of white light emitting diodes for evaluation can be newly obtained. Next, each of the white light emitting diodes for evaluation is caused to emit a light at a predetermined current, so that the diodes that produce a color mixture of yellowish white without fail with the blue light, which does not interact with the fluorescent particles, and the yellow light, which interacts with the fluorescent particles in the fluorescent layer for wavelength conversion, and based on the thicknesses of the fluorescent layers, a range of the thickness of the fluorescent layer 179 is determined.

Figure 26:
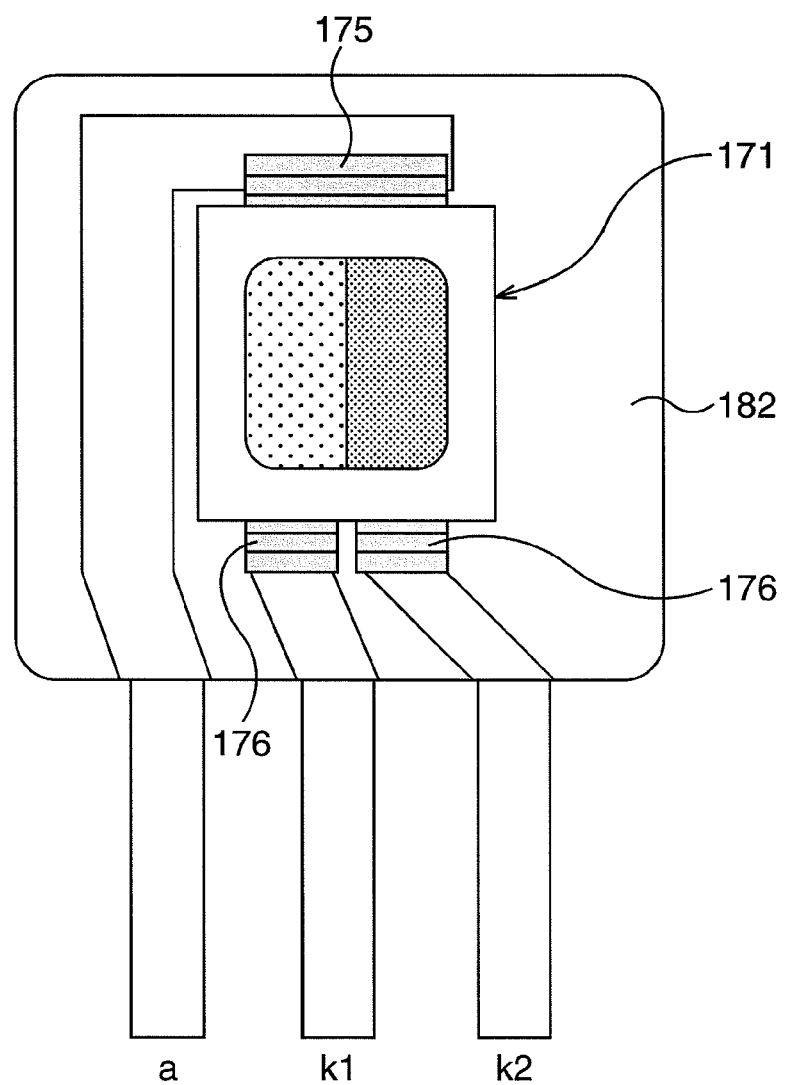
FIG. 26 is a diagram illustrating a state with the white light emitting diode according to the sixth embodiment of the present invention being mounted to a printed circuit board.

The white light emitting diode 171 made as described above may be used by mounting to a printed circuit board 182 as illustrated in FIG. 26, for example. The light emitting diode 171 may be driven by the current control section 133 of the fourth embodiment, for example, and is individually connected to a lead wirings a of the anode wiring 175 and the lead wirings k1, k2 of the two cathode wirings 176. In the case, the white light emitting apparatus having the white light emitting diode 171 has an electrical circuit configuration that is equal to that having the blue LED chips 173 and 174 instead of the white light emitting diodes 111 and 112 of FIG. 18.

The degree of whiteness of the light emitted from the white light emitting diode 171 made as described above may be controlled as follows. First, the current control section 133 is used to set the current value which is applied to the blue LED chips 173 and 174 to be 20 mA, and the PWM method similar to that in the fourth embodiment is used to cause both of the blue LED chips 173 and 174 to be driven. Then, the illumination duration of each of the blue LED chips 173 and 174 for each cycle is controlled to determine a duty ratio to drive each of the blue LED chips 173 and 174 so that the light emitted from the white light emitting diode 171 has an average wavelength distribution (the color mixture) generally at the white point.

The relationship can be explained with reference to the chromaticity diagram of FIG. 27 as follows. The color mixture of the light emitted from the white light emitting diode 171 when only the blue LED chip 173 is lit by applying a current of 20 mA is detected as a chromaticity point WY3, which is substantially positioned on the curved line WY. Similarly, the color mixture of the light emitted from the white light emitting diode 171 when only the blue LED chip 174 is lit by applying a current of 20 mA is detected as a chromaticity point WB3, which is substantially positioned on the curved line WB. This is because the thicknesses of the fluorescent layers 178 and 179 are adequately defined. The coordinates of the chromaticity points WY3 and WB3 on the chromaticity diagram are (Cx=0.36 or more, Cy=0.39 or more), and (Cx=0.26 or less, Cy=0.25 or less), for example, respectively. Therefore, the chromaticity coordinates may be outside the chromaticity areas a0, b1, b2, and c0 in FIG. 30 that are allowed by selection.

Next, the duty ratios of both of the blue LED chips 173 and 174 in a PWM method driving are individually controlled, and the illumination duration is detected which results in a chromaticity measurement approximately equal to the whiteness point (Cx=0.33, Cy=0.33) for the color mixture of the light emitted from the white light emitting diode 171.

As described above, the white light emitting diode 171 of the sixth embodiment includes two blue LED chips 173 and 174 therein, and has YAG fluorescent layers 178 and 179 that cover the chips 173 and 174, and have adequately defined thicknesses. And the control of the duty ratio for lighting the blue LED chip 173, which is covered with both of the fluorescent layers 178 and 179, allows the amount of the emitted yellowish white light to be controlled. Also, the control of the duty ratio for lighting the blue LED chip 174, which is covered with only the fluorescent layer 178, allows the amount of the emitted bluish white light to be controlled. The controls make the color mixture of the light emitted from the white light emitting diode 171 fall on the white point W.

As described above, according to the white light emitting diode 171 of the sixth embodiment, a white light emission can be obtained without special caring about the variation in the inherent wavelengths of the light emitted from the blue LED chip, the variation in the yellow wavelength due to the formation of the fluorescent layers, and the like. Furthermore, the light emission from the white light emitting diode 171 can be readily controlled to be enhanced to a high-quality white light emission. In addition, as compared with the white light emitting diode with one blue LED chip, a higher power emission of white light can be obtained.

Figure 27:
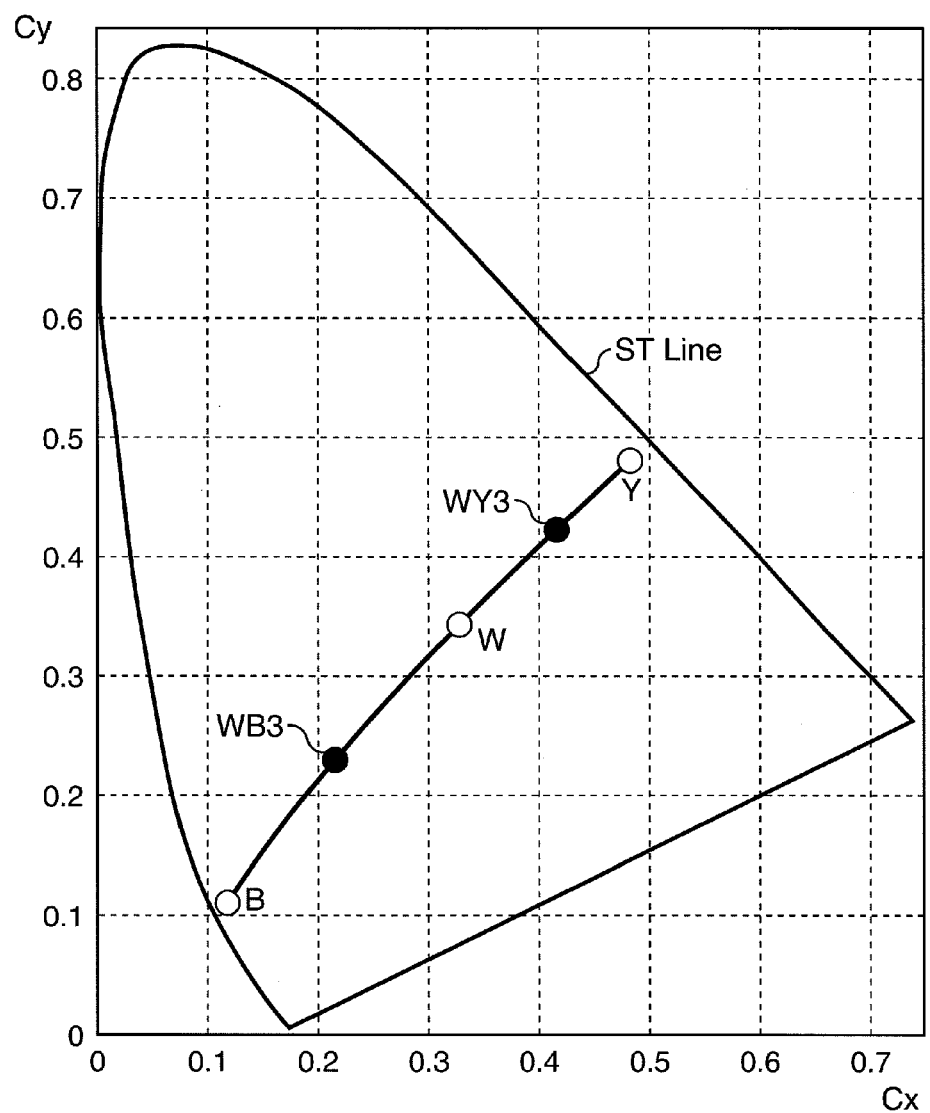
FIG. 27 is a chromaticity diagram illustrating a relationship between chromaticity of emitted lights from the white light emitting diode according to the sixth embodiment t of the present invention.

In the sixth embodiment, the light emission of the white light emitting diode 171 when only the blue LED chip 173 is driven at 20 mA is, as illustrated in FIG. 27, represented by the chromaticity point WY3 for yellowish white without fail. Similarly, the light emission of the white light emitting diode 171 when only the blue LED chip 174 is driven is, as illustrated in FIG. 27, represented by the chromaticity point WB3 for bluish white without fail. When the thicknesses of the fluorescent layers 178 and 179 are adequately determined and reliable yellow and blue colors are obtained, the chromaticity points WY3 and WB3 may be set at the positions separated from the chromaticity point WY1 for "yellowish white" and the chromaticity point WB1 for "bluish white" in the fourth embodiment respectively (FIG. 19) based on the chromaticity point W for white color as a reference. This is because the control of the drive currents that are applied to each of the blue LED chips 173 and 174 allows the chromaticity of the light emitted from white light emitting diode 171 also to reach the white point W as in the case of the fourth embodiment. Furthermore, according to the white light emitting diode 171 of the sixth embodiment, the chromaticity of emitted light can be controlled within a range from the chromaticity point WY3 to the chromaticity point WB3 along the curved line YB, which is wider than that of the fourth embodiment.

In the sixth embodiment, the ratio of wavelength conversion of the blue lights from the blue LED chips 173 and 174 to yellow lights is controlled using the thicknesses of the fluorescent layers 178 and 179, but the ratio may be controlled by the concentration of YAG fluorescent particles dispersed in the fluorescent layers 178 and 179. Also, in the sixth embodiment, the amounts of the emitted yellowish light and the emitted bluish light are controlled using the illumination duration per pulse, but may be controlled using the current values applied to the blue LED chips 173 and 174.

[Seventh Embodiment]

A linear illuminator 190 according to a seventh embodiment uses the white light emitting diode 171 according to the sixth embodiment. The linear illuminator 190 will be explained below in detail with reference to FIGS. 28 and 29.

Figure 28:
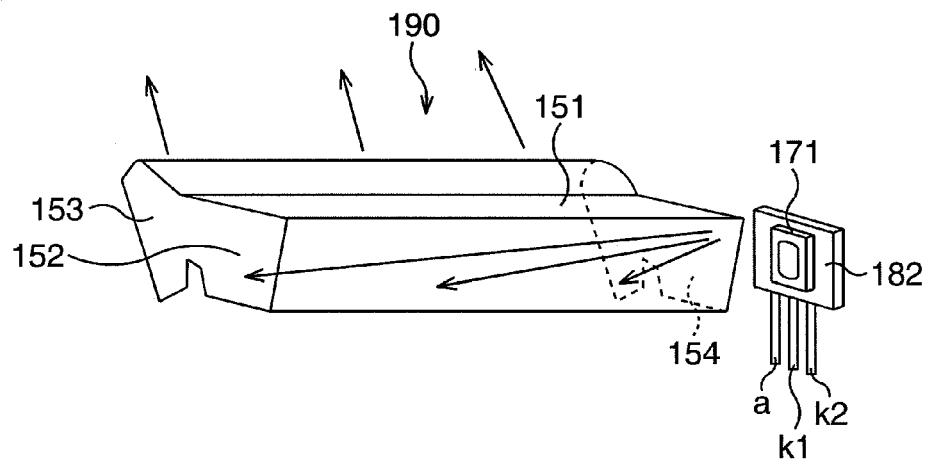
FIG. 28 is a perspective diagram illustrating a linear illuminator according to a seventh embodiment of the present invention.

The linear illuminator 190 of the seventh embodiment is also used to illuminate a surface of a manuscript such as a paper in an image reading apparatus, for example. The linear illuminator 190 is configured with a printed circuit board 182 to which the white light emitting diode 171 according to the sixth embodiment is mounted, instead of the light source section 110 in the fifth embodiment, as illustrated in FIG. 28.

Figure 29:
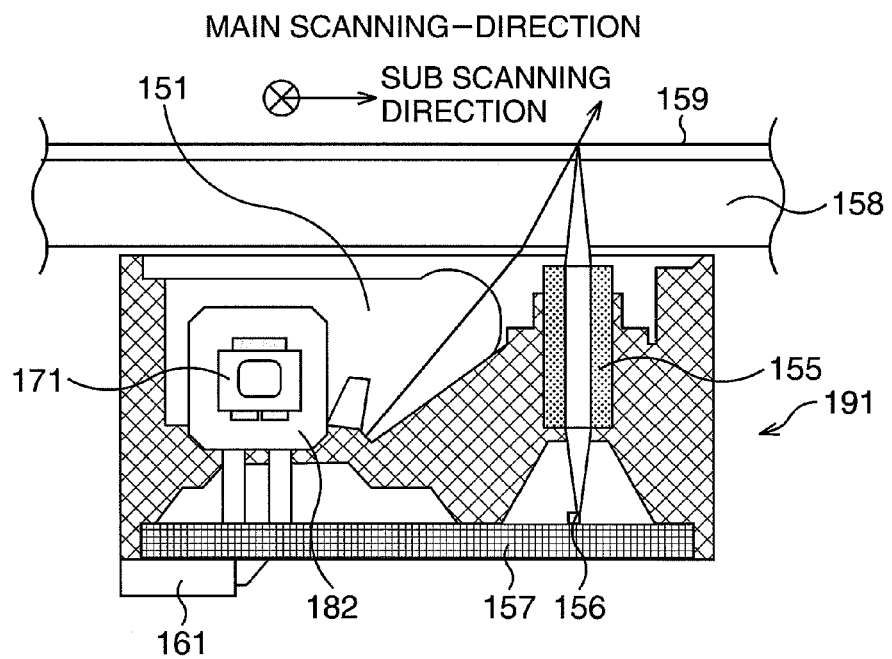
FIG. 29 is a cross sectional diagram illustrating a contact-type image sensor unit in which the linear illuminator according to the seventh embodiment of the present invention is incorporated.

The linear illuminator 190 incorporated in a CIS unit 191 provides the image reading apparatus illustrated in FIG. 29. Not illustrated, but similar to the fifth embodiment, the current control section 133 is connected via the connector 161. Other configurations are similar to those in the fifth embodiment.

Therefore, even in the case where there is a difference in wavelengths of emitted lights between the blue LED chips 173 and 174 in the white light emitting diode 171 used as a light source and the two central points of the emitted lights are not at the same position, the light guide member 151 is able to emit a linear illumination light of uniformly distributed color of whiteness after sufficient color mixture of incident lights from the light incident surface 154.

The inventors of the present invention checked the above described effect of the linear illuminator 190 of the seventh embodiment in the following procedure. As in the case of the fifth embodiment, the linear illuminator 190 was incorporated in the CIS unit 191 that constitutes an image reading apparatus.

Next, as in the case of the fifth embodiment, after the paper manuscript 159 was replaced with a predetermined white paper for reference, the blue LED chips 173 and 174 with the current control section 133 were simultaneously driven at a current value of 20 mA using the PWM method. Then the relative illuminance of each of R, G, and B colors and the illuminance distribution in the linear direction were measured.

Then, similar to the fifth embodiment, based on the measured result, each of the duty ratios of the current pulses for driving the blue LED chips 173 and 174 were adjusted, as the result of that the relative illuminance of each of R; G, and B colors could be adjusted to be generally uniformly distributed across the entire width of the original paper copy 159.

The above result of the present seventh embodiment showed the manufacture of the linear illuminator 190 can be achieved that emits a light with the relative illuminance of each of R, G, and B colors being well balanced using the white light emitting diode 171.

INDUSTRIAL APPLICABILITY

The white light emitting apparatus and line illuminator according to the present invention are advantageously utilized in an image reading apparatus that supports reading of color images such as an image scanner, a facsimile machine, or a copier.

What is claimed is:

1. A white light emitting apparatus for an image reading apparatus, that uses a white LED having a blue LED chip and a phosphor, comprising:

a light source section in which a first white LED that emits white light whose chromaticity deviates to a blue side from a predetermined white region of a CIE chromaticity diagram and a second white LED that emits white light whose chromaticity deviates to a yellow side from the predetermined white region are adjacently disposed such that optical axes thereof are in substantially the same direction; and a current regulator that independently drives the blue LED chip of the first and second white LEDs, respectively, wherein the current regulator performs PWM control for a drive current of at least one of the first and second white LEDs, and by setting respective pulse widths for driving the first and second white LEDs that are inversely proportional to a distance from a target chromaticity point to a chromaticity point of emitted light of the first white LED and a distance from the target chromaticity point to a chromaticity point of emitted light of the second white LED on a CIE chromaticity diagram, adjusts a color mixture of lights emitted from the first and second white LEDs to a chromaticity of the predetermined white region.

2. A white light emitting apparatus for an image reading apparatus, that uses a white LED having a blue LED chip and a phosphor, comprising:
- a light source section in which a first white LED that emits white light whose chromaticity deviates to a blue side from a predetermined white region of a CIE chromaticity diagram and a second white LED that emits white light whose chromaticity deviates to a yellow side from the predetermined white region are adjacently disposed such that optical axes thereof are in substantially the same direction; and
- a current regulator that independently drives the blue LED chip of the first and second white LEDs, respectively,
- wherein, the current regulator:
- continuously supplies a constant current to one white LED among the first and second white LEDs that emits white light whose chromaticity is nearer to a target chromaticity point on the CIE chromaticity diagram, and supplies a PWM-controlled current to another white LED among the first and second white LEDs,
- sets a duty ratio of the PWM control to a value of an inverse ratio between a distance between a chromaticity of the one white LED and the target chromaticity point and a distance between a chromaticity of the other white LED and the target chromaticity point on the CIE chromaticity diagram, and
- adjusts a color mixture of emitted lights from the first and second white LEDs to a chromaticity of the predetermined white region.

3. A line illuminator configured to emit light that is incident from a light source disposed toward a light incident surface provided at an end surface in a length direction of a bar-shaped light guide member formed of a clear member from a light emitting surface provided along a length direction while causing the light to be reflected by an inner surface of the bar-shaped light guide member, wherein the light source is a white light emitting apparatus according to claim 1.

4. A line illuminator configured to emit light that is incident from a light source disposed toward a light incident surface provided at an end face in a length direction of a bar-shaped light guide member formed of a clear member from a light emitting surface provided along a length direction while causing the light to be reflected by an inner surface of the bar-shaped light guide member, wherein the light source is a white light emitting apparatus according to claim 2.

5. The line illuminator according to claim 3, wherein an external shape of a radiating surface that radiates a light of the white light emitting apparatus is of dimensions that can be included in an external shape of the light incident surface of the light guide member.

6. The line illuminator according to claim 4, wherein an external shape of a radiating surface that radiates a light of the white light emitting apparatus is of dimensions that can be included in an external shape of the light incident surface of the light guide member.

7. A white light emitting apparatus, comprising:
- first and second blue light emitting diode chips;
- a wavelength conversion layer for wavelength conversion of a part of blue light from the first and second blue light emitting diode chips into yellow light; and
- a current controller controlling drive currents of the first and second blue light emitting diode chips, wherein
- color mixture with the yellow light obtained by the wavelength conversion of a part of blue light from the first blue light emitting diode chip by the wavelength conversion layer and the remained part of blue light from the first blue light emitting diode chip results in yellowish white, and
- color mixture with the yellow light obtained by the wavelength conversion of a part of blue light from the second blue light emitting diode chip by the wavelength conversion layer and the remained part of blue light from the second blue light emitting diode chip results in bluish white.

8. The white light emitting apparatus according to claim 7, wherein the current controller controls duty ratios of outputs of the drive currents.

9. The white light emitting apparatus according to claim 7, wherein the current controller controls values of the drive currents.

10. A linear illuminator, comprising:
- a white light emitting apparatus; and
- a light guide member guiding a light incident from the white light emitting apparatus and linearly illuminating an object to be illuminated, wherein
- the white light emitting apparatus comprises:
- first and second blue light emitting diode chips;
- a wavelength conversion layer for wavelength conversion of a part of blue light from the first and second blue light emitting diode chips into yellow light; and
- a current controller controlling drive currents of the first and second blue light emitting diode chips, wherein
- color mixture with the yellow light obtained by the wavelength conversion of a part of blue light from the first blue light emitting diode chip by the wavelength conversion layer and the remained part of blue light from the first blue light emitting diode chip results in yellowish white, and
- color mixture with the yellow light obtained by the wavelength conversion of a part of blue light from the second blue light emitting diode chip by the wavelength conversion layer and the remained part of blue light from the second blue light emitting diode chip results in bluish white.

11. A linear illuminator, comprising:
- a white light emitting diode; and
- a light guide member guiding a light incident from the white light emitting diode and linearly illuminating an object to be illuminated, wherein
- the white light emitting diode comprises:
- first and second blue light emitting diode chips; and
- a wavelength conversion layer for wavelength conversion of a part of blue light from the first and second blue light emitting diode chips into yellow light, wherein
- color mixture with the yellow light obtained by the wavelength conversion of a part of blue light from the first blue light emitting diode chip by the wavelength conversion layer and the remained part of blue light from the first blue light emitting diode chip results in yellowish white, and
- color mixture with the yellow light obtained by the wavelength conversion of a part of blue light from the second blue light emitting diode chip by the wavelength conversion layer and the remained part of blue light from the second blue light emitting diode chip results in bluish white.

* * * * *